(12) United States Patent
Higashi et al.

(10) Patent No.: US 6,310,806 B1
(45) Date of Patent: Oct. 30, 2001

(54) SEMICONDUCTOR MEMORY DEVICE WITH REDUNDANT CIRCUIT

(75) Inventors: Tomoki Higashi, Kawasaki; Hiroaki Nakano, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/716,322

(22) Filed: Nov. 21, 2000

(30) Foreign Application Priority Data

Nov. 26, 1999 (JP) .................................................. 11-336607

(51) Int. Cl.$^7$ ....................................................... G11C 7/00
(52) U.S. Cl. ................ 365/200; 365/230.03; 365/230.06
(58) Field of Search .............................. 365/200, 230.03, 365/230.06, 230.08

(56) References Cited

U.S. PATENT DOCUMENTS 5,299,164 * 3/1994 Takeuchi et al. ............ 365/230.03 X
5,475,648 * 12/1995 Fujiwara ........................ 365/200 X
6,215,699 * 4/2001 Yamamoto ..................... 365/200 X

FOREIGN PATENT DOCUMENTS 4-369265   12/1992  (JP) .

* cited by examiner

Primary Examiner—Huan Hoang
(74) Attorney, Agent, or Firm—Banner & Witcoff, Ltd.

(57) ABSTRACT

A redundant memory circuit stores a defective row address. A switch circuit connects a spare row decoder with the wire for transmitting a row address signal according to the defective row address stored in the redundant memory circuit when the power supply is turned on. A row decoder deactivating circuit, when the power supply is turned on, deactivates the part of the row decoder corresponding to the defective row address according to the defective row address stored in the redundant memory circuit. As a result, when the row address buffer outputs the row address signal corresponding to the defective row address, the spare row decoder decodes the row address signal, thereby selecting a spare word line immediately.

20 Claims, 20 Drawing Sheets

SEMICONDUCTOR MEMORY DEVICE WITH REDUNDANT CIRCUIT

CROSS-REFERENCE TO RELATED APPLICATIONS

This application is based upon and claims the benefit of priority from the prior Japanese Patent Application No. 11-336607, filed Nov. 26, 1999, the entire contents of which are incorporated herein by reference.

BACKGROUND OF THE INVENTION

This invention relates to a semiconductor memory device, and more particularly to a redundant circuit for relieving defects in the memory cells arranged, for example, in the direction of row (or in the direction of word line).

Redundancy techniques have been applied to semiconductor memory devices to improve the yield and increase the proceeds from manufacture efficiently. Redundancy techniques are the techniques for replacing defective cells because of defects with spare cells previously provided.

FIG. 30 is a block diagram showing the main part of a semiconductor memory device with a conventional redundant circuit, such as a dynamic random access memory (DRAM).

In FIG. 30, a semiconductor memory device 10 comprises a memory cell array 11 and a spare cell array 12 for relieving defective memory cells in the memory cell array 11. The memory cell array 11 includes word lines WL and bit lines BL and has memory cells MC at the intersections of the individual word lines and bit lines BL. The spare cell array 12 includes spare word lines SWL and the bit lines BL and has spare memory cells (not shown) at the intersections of the spare word lines SWL and bit lines BL.

A row address buffer 13 receives address signals A0 to An supplied from the external device according to a row address strobe signal RAS and generates a row address signal. A column address buffer 14 receives an address signal supplied from the external device according to a column address strobe signal CAS and generates a column address signal. The row address signal outputted from the row address buffer 13 is supplied to a row decoder 15. The row decoder 15 selects a word line WL in the memory cell array 11 in accordance with the row address signal. The column address signal outputted from the column address buffer 14 is supplied to a column decoder 16. The column decoder 16 selects a bit line in the memory cell array 11 in accordance with the column address signal. An input/output buffer 17 holds write data and read data. Between the column decoder 16 and memory cell array 11, an I/O (input/output) gate 18 is provided. According to the output signal from the column decoder 16, the I/O gate 18 connects the bit line BL with the input/output buffer 17.

Near the spare cell array 12, there is provided a spare row decoder (SRD) 19 for selecting a spare word line SWL. A redundant memory circuit 20 stores the row addresses of defective memory cells. Between the redundant memory circuit 20 and row address buffer 13, a judgment circuit 21 is provided. The judgment circuit 21 compares the row address supplied from the row address buffer 13 with the row address of the defective memory cell stored in the redundant memory circuit 20. The judgment circuit 21, when these row addresses coincide with each other, deactivates the row decoder 15 and activates the spare row decoder 19.

The redundant memory circuit 20 is composed of, for example, fuses and latch circuits. When the result of the initial test (die sort test) has shown that there is a defective memory cell in the memory cell array 11, a specific fuse is blown by, for example, a laser and information on the defective row address corresponding to the defective memory cell is stored in a latch circuit.

The operation carried out up to the step of activating a word line will be explained.

The row address buffer 13 receives an external address signal according to the row address strobe signal RAS and generates a row address signal. Next, the judgment circuit 21 compares the row address signal with the defective row address stored in the redundant memory circuit 20. When the result of the comparison has shown that they coincide with each other, the output of the judgment circuit 21 deactivates the row decoder 15 and activates the spare row decoder 19, thereby selecting a spare word line SWL. When the result has shown that they do not coincide with each other, the output of the judgment circuit 21 deactivates the spare row decoder 19 and activates the row decoder 15. The row decoder 15 then selects a word line WL.

In the conventional method, each time the row address buffer 13 outputs a row address signal, the judgment circuit 21 compares the row address signal with the defective address signal. According to the result of the comparison at the judgment circuit 21, the row decoder 15 or spare row decoder 19 is activated or deactivated, thereby selecting a word line or spare word line. As a result, the comparison time at the judgment circuit 21 hinders the memory from being accessed at higher speed.

BRIEF SUMMARY OF THE INVENTION

It is, accordingly, an object of the present invention to overcome the above disadvantage by providing a semiconductor memory device capable of shortening the memory access time.

The foregoing object is accomplished by providing a semiconductor memory device comprising: a memory cell array including a plurality of memory cells arranged in rows and columns; a spare cell array including spare cells, the spare cells being to be replaced with defective memory cells in the memory cell array; a memory circuit for storing the addresses of the defective memory cells; an address buffer for outputting addresses for selecting the memory cells; a decoder for selecting a memory cell in the memory cell array according to the address signal outputted from the address buffer and which includes a select circuit for the memory cells and a control circuit for deactivating the select circuit according to the address signal for the defective memory cell; a spare decoder for selecting a spare cell in the spare array; and a switch circuit which is connected between the spare decoder and the address buffer and which enables only the defective address supplied from the address buffer to pass through according to the address of the defective memory cell outputted from the memory circuit when a power supply is turned on.

The foregoing object is further accomplished by providing a semiconductor memory device comprising: a memory cell array including a plurality of memory cells arranged in rows and columns; a spare cell array which is arranged adjacent to the memory cell array and includes spare cells; an address buffer for outputting addresses for selecting the memory cells; a memory circuit for storing the address of a defective memory cell in the memory cell array; a switching circuit which is connected between the memory circuit and address buffer and which outputs the defective address outputted from the memory circuit at the time of turning on a power supply and, in a normal operation, outputs the address from the address buffer; a decoder for selecting a memory cell in the memory cell array according to the address signal outputted from the switching circuit; a spare decoder for selecting a spare cell in the spare cell array; and a switch circuit which is connected between the output terminal of the switching circuit and spare decoder and which does switching in such a manner that it enables only the address of the defective memory cell supplied from the address buffer to pass through according to the address of the defective memory cell outputted from the switching circuit at the time of turning on the power supply, wherein the decoder includes a select circuit for selecting the memory cell corresponding to the defective address according to the defective address supplied from the switching circuit and a control circuit for deactivating the select circuit.

The foregoing object is still further accomplished by providing a semiconductor memory device comprising: a memory cell array including a plurality of memory cell blocks, each of the memory cell blocks having a plurality of memory cells arranged in rows and columns; spare cell arrays arranged adjacent to the respective memory cell blocks, each of the spare cell arrays including a plurality of spare cells, the spare cell being to be replaced with defective memory cells in the memory cell array; an address buffer for outputting an address for selecting a memory cell in each of the memory cell blocks; a plurality of decoders for selecting a memory cell in each of the memory cell blocks according to the address outputted from the address buffer and which each includes a select circuit for the memory cell and a control circuit for deactivating the select circuit according to the address signal for the defective memory cell; a plurality of spare decoders for selecting spare cells in the respective spare cell arrays; a plurality of driving circuits for driving a spare cell according to the output signal of each of the spare decoders; a plurality of memory circuits for storing the address of a defective memory cell in each of the memory cell blocks; and a plurality of switch circuits which are connected between the address buffer and the respective spare decoders and which do switching in such a manner that they enable only the address of the defective memory cell supplied from the address buffer to pass through according to the address of the defective memory cell outputted from the memory circuit at the time of turning on a power supply.

With the present invention, after the power supply has been turned on, the wire for transmitting the row address signal is connected to the spare row decoder circuit according to the defective row address signal previously stored in the redundant memory circuit and the row decoder circuit replaced with the spare row decoder circuit is deactivated. This enables the memory cells to be accessed at higher speed than in a case where the row address signal is compared with the defective row address signal stored in the redundant memory circuit each time a row address signal is generated and, on the basis of the result of the comparison, the spare row decoder or row decoder is activated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

<First Embodiment>

Figure 1:
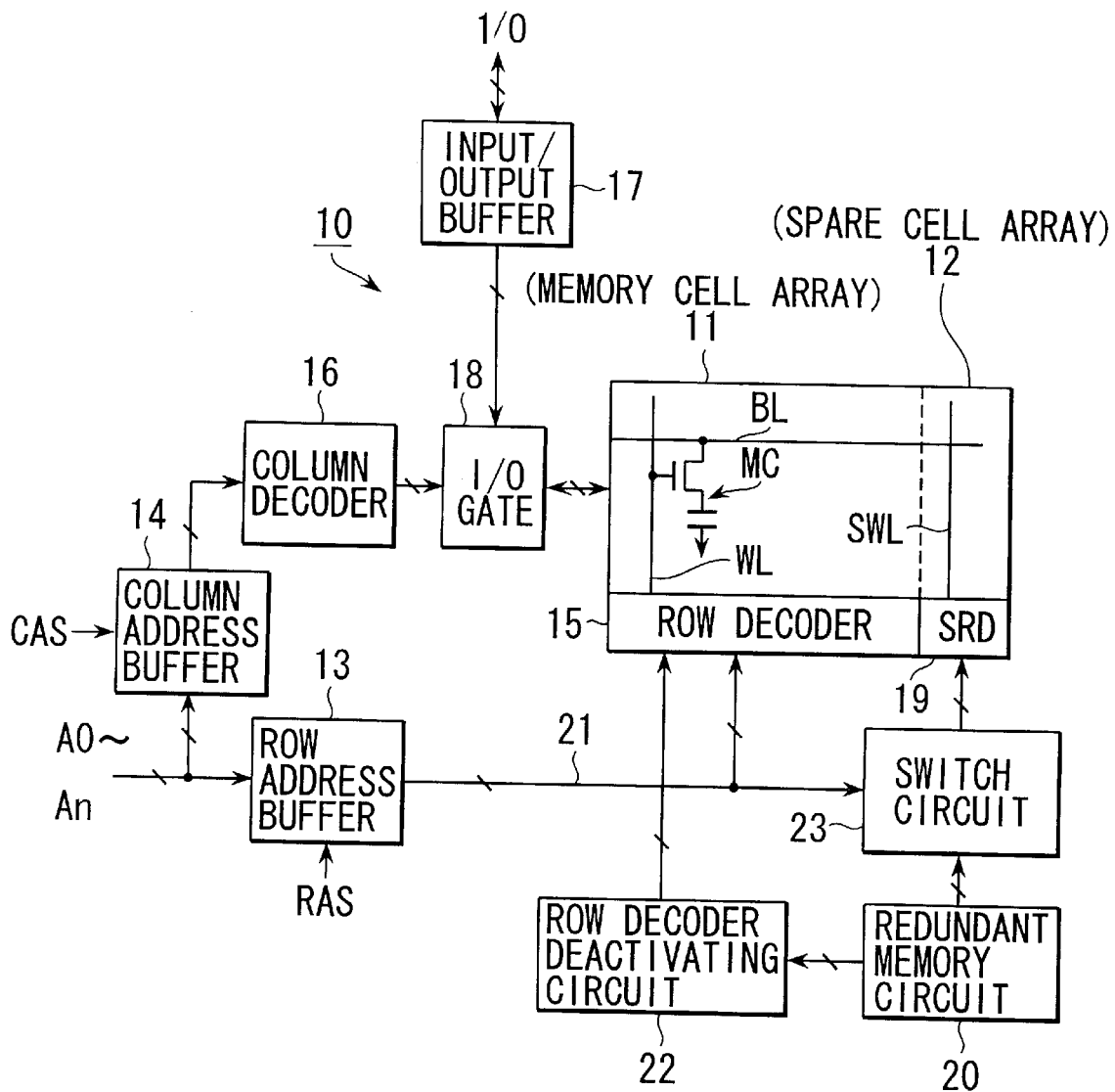
FIG. 1 is a block diagram of a semiconductor memory device according to a first embodiment of the present invention.
Figure 30:
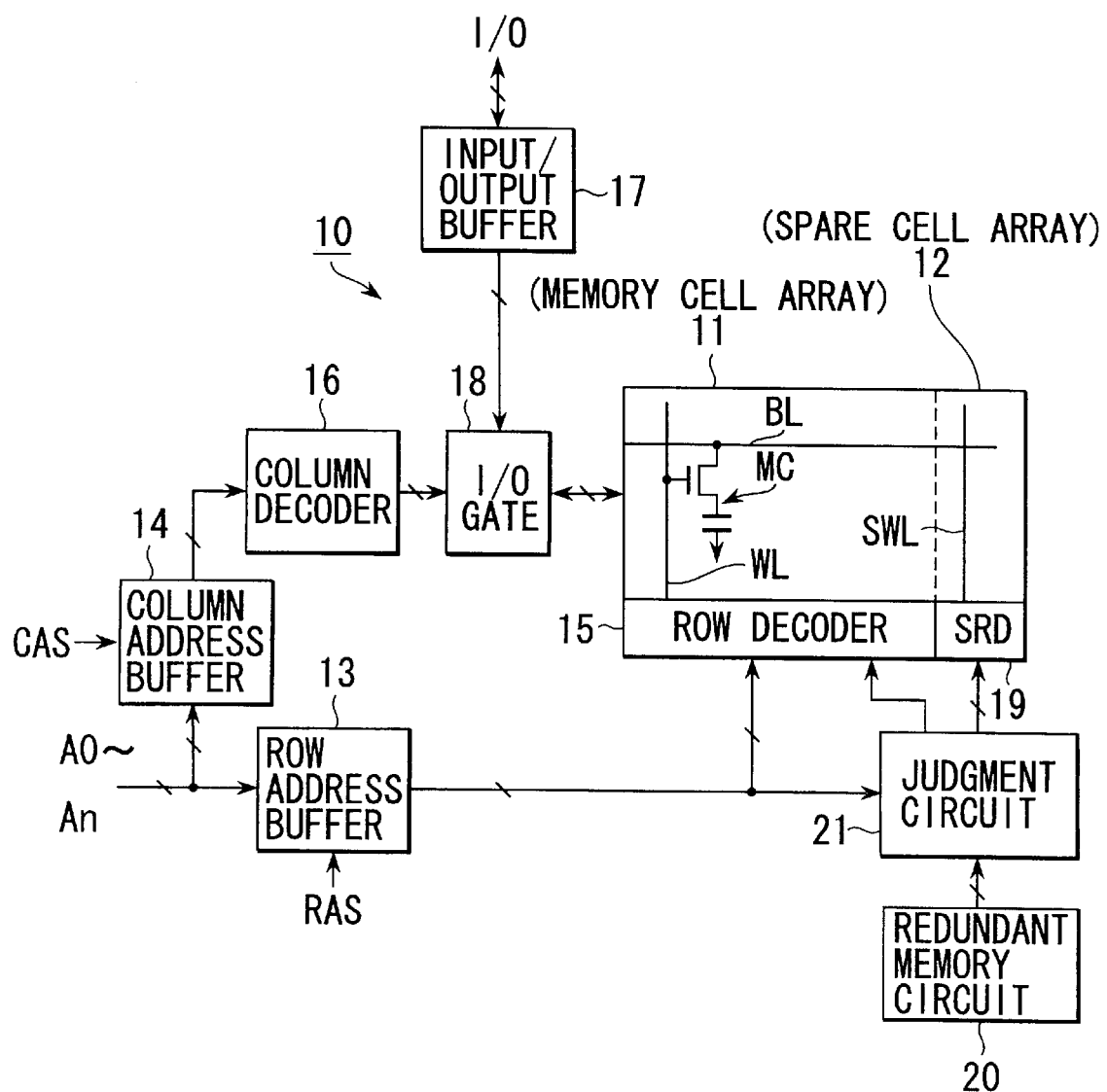
FIG. 30 is a block diagram of a semiconductor memory device with a conventional redundant memory circuit.

FIG. 1 is a block diagram of a semiconductor memory device, such as a DRAM with a row redundant circuit, according to a first embodiment of the present invention. In FIG. 1, the same parts as those in FIG. 30 are indicated by the same reference numerals.

As shown in FIG. 1, a semiconductor memory device 10 has a memory cell array 11. The memory cell array 11 includes memory cells MC arranged in rows and columns, word lines WL placed at the respective rows, and bit lines placed at the respective columns and, together with the word lines WL, selecting the memory cells MC. Each of the memory cells MC is composed of, for example, a transistor and a capacitor. At the end of the memory cell array 11 in the direction of column, a spare cell array 12 for relieving defective memory cells is provided. The spare cell array 12 includes spare word lines SWL, the bit lines BL, and spare cells (not shown) placed at the intersections of these spare word lines SWL and bit lines BL. The configuration of the spare cell is the same as that of the memory cell.

In the vicinity of the memory cell array 11, a row address buffer 13 and a column address buffer 14 are provided. According to a row address strobe signal RAS, the row address buffer 13 receives address signals A0 to An supplied from the external device (not shown) and generates a row address. According to a column address strobe signal CAS, the column address buffer 14 receives an address signal supplied from the external device and generates a column address signal. The row address signal outputted from the row address buffer 13 is supplied to a row decoder 15. The row decoder 15 selects a word line WL in the memory cell array 11 according to the row address signal. The column address signal outputted from the column address buffer is supplied to a column decoder 16. The column decoder 16 selects a bit line BL in the memory cell array 11 according to the column address signal. An input/output buffer 17 holds write data and read data. Between the column decoder 16 and memory cell array 11, an I/O (input/output) gate 18 is provided. The I/O gate 18 connects the bit line with the input/output buffer 17 according to the output signal of the column decoder 16.

In the vicinity of the spare cell array 12, a spare row decoder (SRD) 19 for selecting a spare word line SWL is provided. A redundant memory circuit 20 stores the row addresses of defective memory cells (hereinafter, referred to as defective row addresses).

Between the redundant memory circuit 20 and row decoder 15, a row decoder deactivating circuit 22 is connected. The row decoder deactivating circuit 22, when the power is turned on, deactivates the parts of the row decoder 15 which select the defective word lines replaced with the spare row decoder 19 according to the defective row address stored in the redundant memory circuit 20.

In addition, between the redundant memory circuit 20 and spare row decoder 19, a switch circuit 23 is provided.

According to the defective row addresses stored in the redundant memory circuit 20 at the time of the turning on of the power supply, the switch circuit 23 connects a wire 21 for transmitting the row address signal outputted from the row address buffer 13 with the spare row decoder 19.

Next, a concrete configuration of each of the above circuits will be explained.

Figure 2:
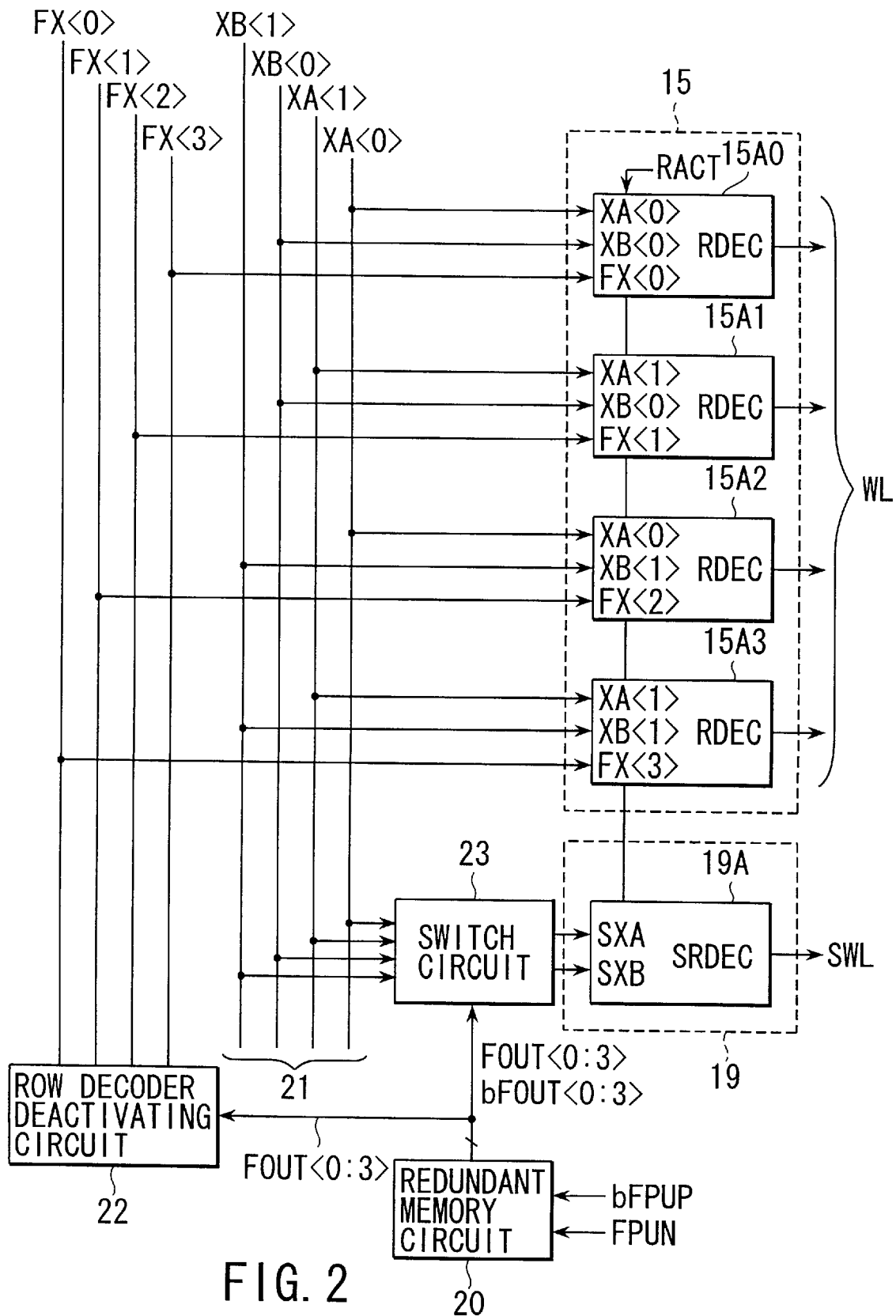
FIG. 2 is a block diagram of the row redundant circuit in FIG. 1.

FIG. 2 is a block diagram of an example of the row redundant circuit in the semiconductor memory device shown in FIG. 1. In the first embodiment, to simplify the explanation, a case where four row decoders and one spare row decoder are used will be explained. The present invention, however, may be applied to a case where three or fewer or five or more row decoders and two or more spare row decoders are used.

The row decoder 15 includes row decoder circuits (RDEC) 15A0 to 15A3 for selecting a word line WL in the memory cell array 11 according to row addresses XA<0>, XA<1> (hereinafter, abbreviated as XA<0:1>) and XB<0:1> supplied from the row address buffer 13. The spare row decoder 19 includes a spare row decoder circuit (SRDEC) 19A for selecting a spare word line SWL in the spare cell array 12.

When the power supply is turned on, a signal FPUN and a signal bFPUP (b means the signal is a low active signal) are externally supplied to the redundant memory circuit 20. According to the signal FPUN and signal bFPUP, the redundant memory circuit 20 outputs the defective row address signals FOUT<0:3> and their inverted signals bFOUT<0:3>. The defective row address signals FOUT<0:3> and bFOUT<0:3> are supplied to said switch circuit 23 and the defective row address signals FOUT<0:3> are supplied to the row decoder deactivating circuit 22.

According to the defective row address signals FOUT<0:3> supplied from the redundant memory circuit 20, the row decoder deactivating circuit 22 outputs row deactivating signals FX<0:3> for deactivating the row decoder circuits 15A0 to 15A3. The row decoder deactivating signals FX<0:3> are supplied to the input terminals FX<0>, FX<1>, FX<2>, and FX<3> of the row decoder circuits 15A0 to 15A3.

According to the defective row address signals FOUT<0:3> and bFOUT<0:3> supplied from the redundant memory circuit 20, the switch circuit 23 connects the wire 21 for transmitting the row address signals XA<0:1> and XB<0:1> with the wire for transmitting the spare row address signals SXA and SXB of the spare row decoder circuit SRDEC. The details of the switch circuit 23 will be explained later.

The row address signals XA<0:1>, XB<0:1> are signals obtained by decoding external addresses. When the memory is in operation, either of XA<0:1> and either of XB<0:1> are selected without fail. The defective row address signals FOUT<0:1> correspond to the row address signals XA<0:1> and the defective row address signals FOUT<2:3> correspond to XB<0:1>. That is, when the defective row address signal FOUT<0> is high, XA<0> goes high.

Figure 3A:
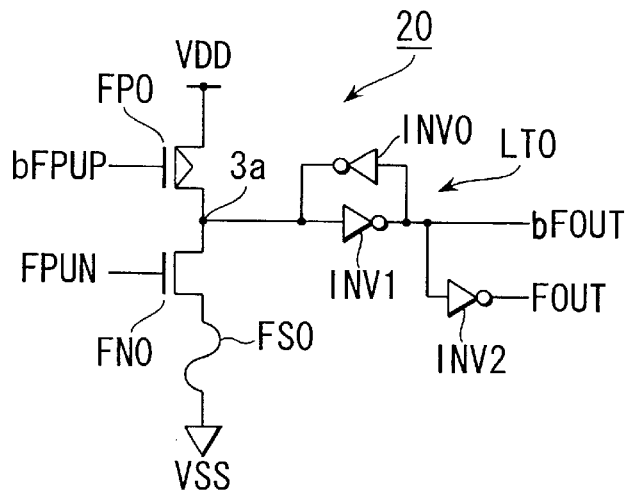
FIG. 3A is a circuit diagram of an example of the redundant memory circuit in FIG. 2

FIG. 3A shows an example of the redundant memory circuit 20. In this example, to simplify the explanation below, only the redundant memory circuit corresponding to a single row address signal is shown. Actually, however, there are as many redundant memory circuits as there are row address signals. In FIG. 3A, a high power-supply potential VDD is supplied to the source of a p-channel MOS transistor FP0, whose drain is connected to a node 3a. The signal bFPUP is supplied to its gate. An n-channel MOS transistor FN0 and a memory element, such as a fuse FS0, are connected in series with the node 3a. To one end of the fuse FS0, a low power-supply potential VSS, such as the ground potential, is supplied. The signal FPUN is supplied to the gate of the n-channel MOS transistor FN0. One end of a latch circuit LT0 composed of two inverter circuits INV0 and INV1 is connected to the node 3a to which the drain of the MOS transistor FP0 and the drain of the MOS transistor FN0 are connected. The latch circuit LT0 outputs the defective row address signal bFOUT at its other end and further the defective row address signal FOUT via an inverter circuit INV2.

Figure 3B:
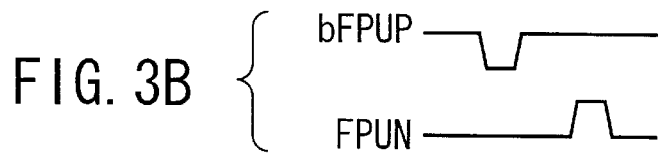
FIG. 3B is a waveform diagram showing the input signal in FIG. 3A.

In the above configuration, when the power supply is turned on, the signals bFPUP and FPUN as shown in FIG. 3B are externally supplied to the gate of the MOS transistor FP0 and that of the MOS transistor FN0. First, when the signal bFPUP is supplied to the gate of the MOS transistor FP0, the node 3a is charged to the high level. Then, when the signal FPUN is supplied to the gate of the MOS transistor FN0, the node 3a goes low unless the fuse FS0 has been blown. As a result, the defective row address signal bFOUT outputted from the latch circuit LT0 goes high and the defective row address signal FOUT outputted from the inverter circuit INV2 goes low. If the fuse has been blown, the node 3a goes high. As a result, the defective row address signal bFOUT goes low and the defective row address signal FOUT goes high.

Figure 4:
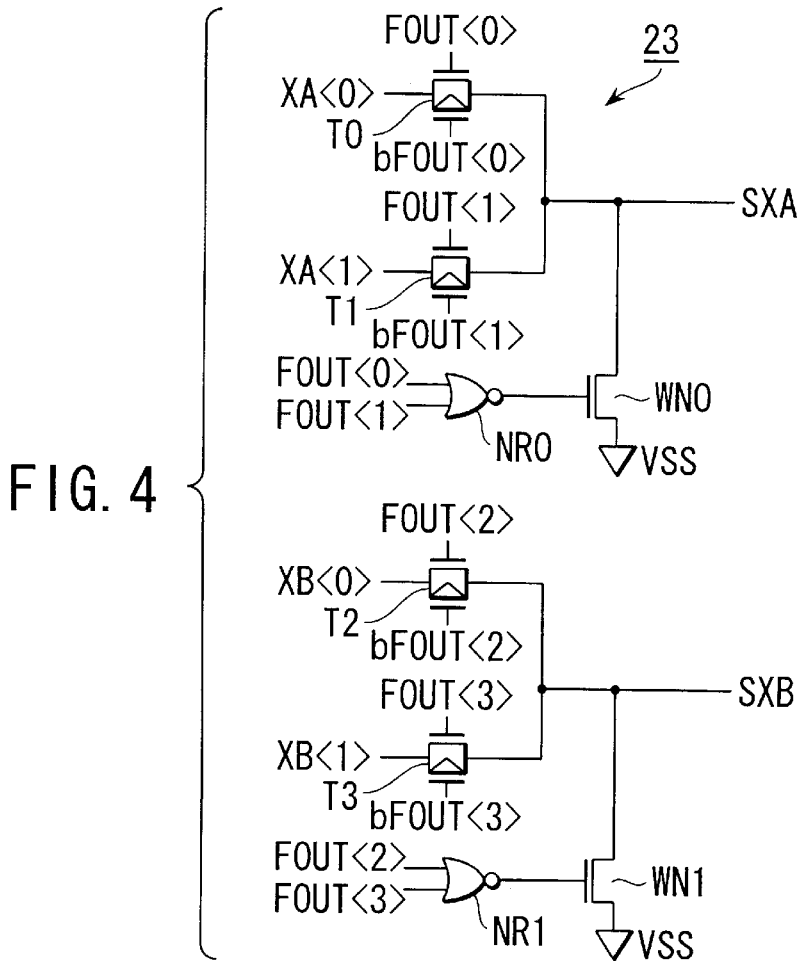
FIG. 4 is a circuit diagram of an example of the switch circuit in FIG. 2.

FIG. 4 shows an example of the switch circuit 23. The row address signals XA<0:1> and XB<0:1> are supplied to the respective input terminals of transfer gates T0, T1, T2, and T3. The output terminals of the transfer gate T0 and T1 are connected to each other and the output terminals of the transfer gate T2 and T3 are connected to each other. The transfer gates T0, T1, T2, and T3 are controlled by the defective row address signals FOUT<0:3> and bFOUT<0:3> supplied from the redundant memory circuit 20. As a result, according to the defective row address signals FOUT<0:3> and bFOUT<0:3>, the transfer gates T0, T1 are capable of outputting either of the row address signals XA<0:1> as a spare row address signal SXA. In addition, the transfer gates T2, T3 are capable of outputting either of the row address signals XB<0:1> as a spare row address signal SXB.

The drain of an n-channel MOS transistor WN0 is connected to the output terminals of the transfer gates T0, T1 and the drain of an n-channel MOS transistor WN1 is connected to the output terminals of the transfer gates T2, T3. The ground potential VSS is supplied to the source of these MOS transistors WN0, WN1. The output terminals of two-input NOR circuits NR0 and NR1 are connected to the gates of the MOS transistors WN0 and WN1, respectively. The defective cell address signals FOUT<0:1> are supplied to the NOR circuit NR0 and the defective cell address signals FOUT<2:3> are supplied to the NOR circuit NR1. Each of these NOR circuits NR0 and NR1 produces a low output signal when one of the two inputs goes high. This brings the MOS transistors WN0, WN1 into the off state, stopping the spare row address signals SXA, SXB from being precharged.

The MOS transistors WN0, WN1 are brought into the on state when the spare row decoder is not used. This prevents the wires for transmitting the spare row address signals SXA, SXB from going into the floating state, which avoids an erroneous operation.

Figure 5:
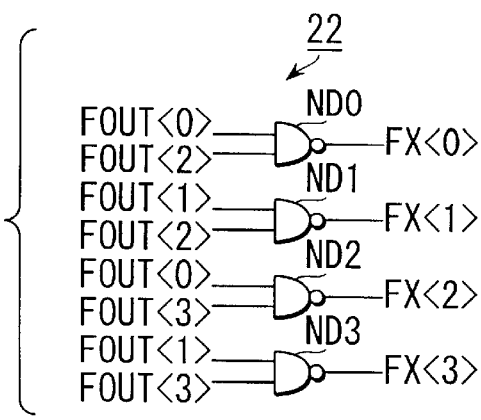
FIG. 5 is a circuit diagram of an example of the row decoder deactivating circuit in FIG. 2.

FIG. 5 shows an example of the row decoder deactivating circuit 22. The defective row address signals FOUT<0:3> stored in the redundant memory circuit 20 are supplied to the two-input NAND circuits ND0 to ND3. These NAND circuits ND0 to ND3 output row decoder deactivating signals FX<0:3>. The row decoder deactivating signals FX<0:3> correspond to the respective row decoder circuits 15A0 to 15A3. When the signal is at the high level, each of the row decoder circuits 15A0 to 15A3 is activated. When the signal is at the low level, each of the row decoder circuits 15A0 to 15A3 is deactivated.

If the fuse in the redundant memory circuit 20 has not been blown, the defective row address signals FOUT<0:3> are at the low level. As a result, the output signal of each of the NAND circuits ND0 to ND3 goes high, which activates the row decoder circuits 15A0 to 15A3. If the fuse in the redundant memory circuit 20 has been blown, either of FOUT<0:1> and either of the defective row address signal FOUT<2:3> in the defective row address signal FOUT<0:3> outputted from the redundant memory circuit 20 go high and the output signal of the NAND circuit whose two inputs are both at the high level goes low. As a result, the row decoders connected to the wires on which the row decoder deactivating signals FX<0:3> have become low are deactivated.

For example, in the first embodiment, if the fuses corresponding to the row address signals XA<0>, XB<1> have been blown, the defective row address signals FOUT<0>, FOUT<3> are brought to the high level. As a result, the row decoder deactivating signal FX<2> outputted from the NANd circuit ND2 to which FOUT<0>, FOUT<3> are supplied goes low. Thus, the row decoder circuit 15A2 to which the row decoder deactivating signal FX<2> is supplied is deactivated.

Figure 6:
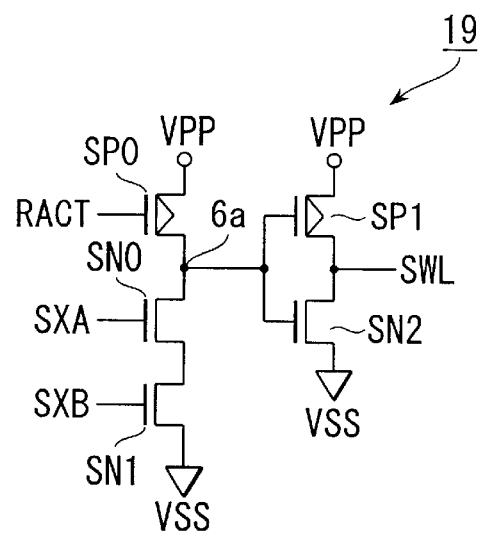
FIG. 6 is a circuit diagram of an example of the spare row decoder in FIG. 2.

FIG. 6 shows an example of the spare row decoder 19. In this example, to simplify the explanation below, only the part corresponding to a single spare word line is shown. A high power-supply potential VPP is supplied to the source of a p-channel MOS transistor SP0, whose drain is connected to a node 6a. A row activating signal RACT is supplied to its gate. To the node 6a, an n-channel MOS transistors SN0 and SN1 are connected in series. Spare row address signals SXA and SXB are supplied to the gates of the MOS transistors SN0 and SN1, respectively. The ground potential VSS is supplied to the source of the MOS transistor SN1. The gate of a p-channel MOS transistor SP1 and that of an n-channel MOS transistor SN2 are connected to the node 6a to which the drain of the MOS transistor SP0 and that of the MOS transistor SN0 have been connected. These transistors SP1 and SN2 constitute an inverter circuit. The power-supply potential VPP is supplied to the source of the MOS transistor SP1, and the ground potential VSS is supplied to the source of the MOS transistor SN2. The drains of these MOS transistors SP1 and SN2 are connected to a specific single spare word line SWL.

In the spare row decoder 19 with the above configuration, when the spare row address signals SXA, SXB go high, turning on the MOS transistors SN0, SN1, the node 6a goes low. As a result, the MOS transistor SP1 turns on, thereby supplying the high potential VPP to the spare word line SWL.

On the other hand, when the row activating signal RACT goes low, with at least one of the MOS transistors SN0 and SN1 being off, the node 6a remains high. As a result, the MOS transistor SP1 turns off and the MOS transistor SN2 turns on. Thus, the ground potential VSS is supplied to the spare word line SWL.

Figure 7:
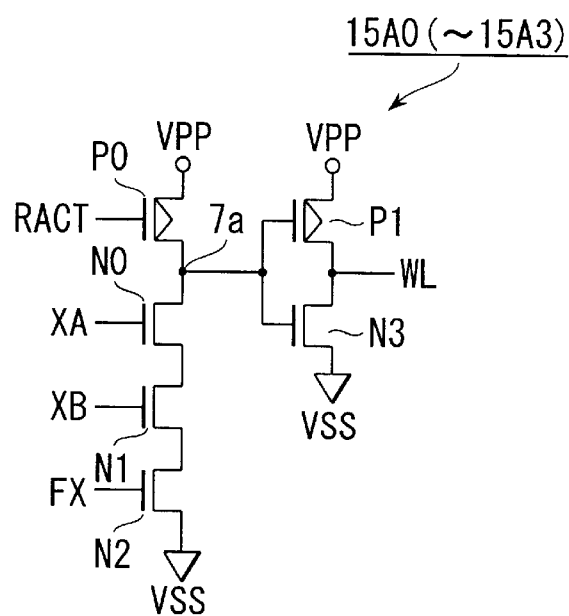
FIG. 7 is a circuit diagram of an example of the row decoder circuit in FIG. 2.

FIG. 7 shows an example of the row decoder 15. In this example, to simplify the explanation below, only the row decoder circuit 15A0 corresponding to a single word line is shown. Actually, however, similar circuits are connected to all the word lines and the row address signals are combined to select a single word line.

The high power-supply potential VPP is supplied to the source of a p-channel MOS transistor P0, whose drain is connected to a node 7a. A row activating signal RACT is supplied to its gate. To the node 7a, an n-channel MOS transistors N0 to N2 are connected in series. Row address signals XA and XB are supplied to the gates of the MOS transistors N0 and N1, respectively, and a row decoder deactivating signal FX is supplied to the gate of the MOS transistor N2. The ground potential VSS is supplied to the source of the MOS transistor N2.

The gate of a p-channel MOS transistor P1 and that of an n-channel MOS transistor N3 are connected to the node 7a. The high power-supply potential VPP is supplied to the source of the MOS transistor P1, and the ground potential VSS is supplied to the source of the MOS transistor N3. The drains of these MOS transistors P1, N3 are connected to a specific single word line WL.

In the row decoder circuit with the above configuration, when the row decoder deactivating signal FX is at the high level and the internal row address signals XA, XB are at the high level, the MOS transistor N0 to N2 are in the on state. As a result, the MOS transistor P1 turns on, thereby supplying the high potential VPP to the word line WL.

On the other hand, when the row activating signal RACT goes low, with at least one of the MOS transistors N0 to N2 being off, the node 7a goes to the high level via the MOS transistor P0. As a result, the MOS transistor P1 turns off and the MOS transistor N3 turns on. Thus, the ground potential VSS is supplied to the word line WL.

Hereinafter, the semiconductor memory device according to the first embodiment will be explained.

In FIG. 2, when the signals bFPUP, FPUN are supplied to the redundant memory circuit 20 at the time of turning on the power supply, the defective row address signal is latched in the latch circuit LT0 of the redundant memory circuit 20. The defective row address signals FOUT<0:3> and bFOUT<0:3> are supplied to the switch circuit 23. The switch circuit 23 selects the transfer gates T0, T1, T2, and T3 according to the defective row address signals FOUT<0:3> and bFOUT<0:3>. Thus, the transfer gates T0, T1 are set so that they may output either of the row address signals XA<0:1> as the spare row address signal SXA. The transfer gates T2, T3 are set so that they may output either of the row address signals XB<0:1> as the spare row address signal SXB. Therefore, when the row address buffer 13 outputs the signal corresponding to a defective row address, the spare row address signal can be outputted immediately according to the defective row address signal.

In the row decoder 15, the row decoder circuit replaced with the spare row decoder 19 is deactivated. Specifically, the defective cell address signals FOUT<0:3> outputted from the redundant memory circuit 20 are supplied to the row decoder deactivating circuit 22, which decodes the signal. When the fuse in the redundant memory circuit 20 has not been blown, all the defective row address signals FOUT<0:3> are at the low level. As a result, the output signals of the NAND circuits ND0 to ND3 shown in FIG. 5 are at the high level. Consequently, there is no row decoder circuit deactivated in the row decoder 15.

On the other hand, when the fuse in the redundant memory circuit 20 has been blown, either of FOUT<0:1> and either of FOUT<2:3> in the defective cell address signals FOUT<0:3> supplied to the row decoder deactivating circuit 22 go high. As a result, the output signal of the NAND circuit whose two inputs are both at the high level goes low, thereby deactivating the row decoder circuit to which the low deactivating signal FX is supplied.

In this way, immediately after the power supply has been turned on, the row decoder circuit corresponding to the defective row address is deactivated and the spare row decoder 19 is activated. Thus, when the row address buffer 13 generates row address signals XA<0:1>, XB<0:1> later, these row address signals are decoded by the row decoder circuits other than the deactivated ones and the spare row decoder 19. Therefore, when the defective row address signal is generated in this state, the spare row decoder 19 activates the spare word line SWL immediately.

With the first embodiment, the switch circuit 23 is driven according to the defective address signal stored in the redundant memory circuit 20 immediately after the power supply has been turned on. The switch circuit 23 connects the wire 21 for transmitting the row address signal with the spare row decoder 19, which causes the row decoder deactivating circuit 22 to deactivate the row decoder circuit corresponding to the defective address signal replaced with the spare row decoder 19. As a result, when the row address buffer 13 outputs the row address signal corresponding to the defective row address, the spare row decoder 19 decodes the row address signal and the spare word line SWL is selected immediately. Therefore, differently from a conventional equivalent, there is no need to compare the row address with the defective row address stored in the redundant memory circuit each time the row address buffer generates a row address. This enables the access time to the memory cell to be shortened remarkably.

<Second Embodiment>

In the first embodiment, the row decoder deactivating circuit has been used to activate or deactivate the row decoder. In contrast, a second embodiment of the present invention realizes a similar function by providing a latch circuit in the row decoder instead of using the row decoder deactivating circuit.

Figure 8:
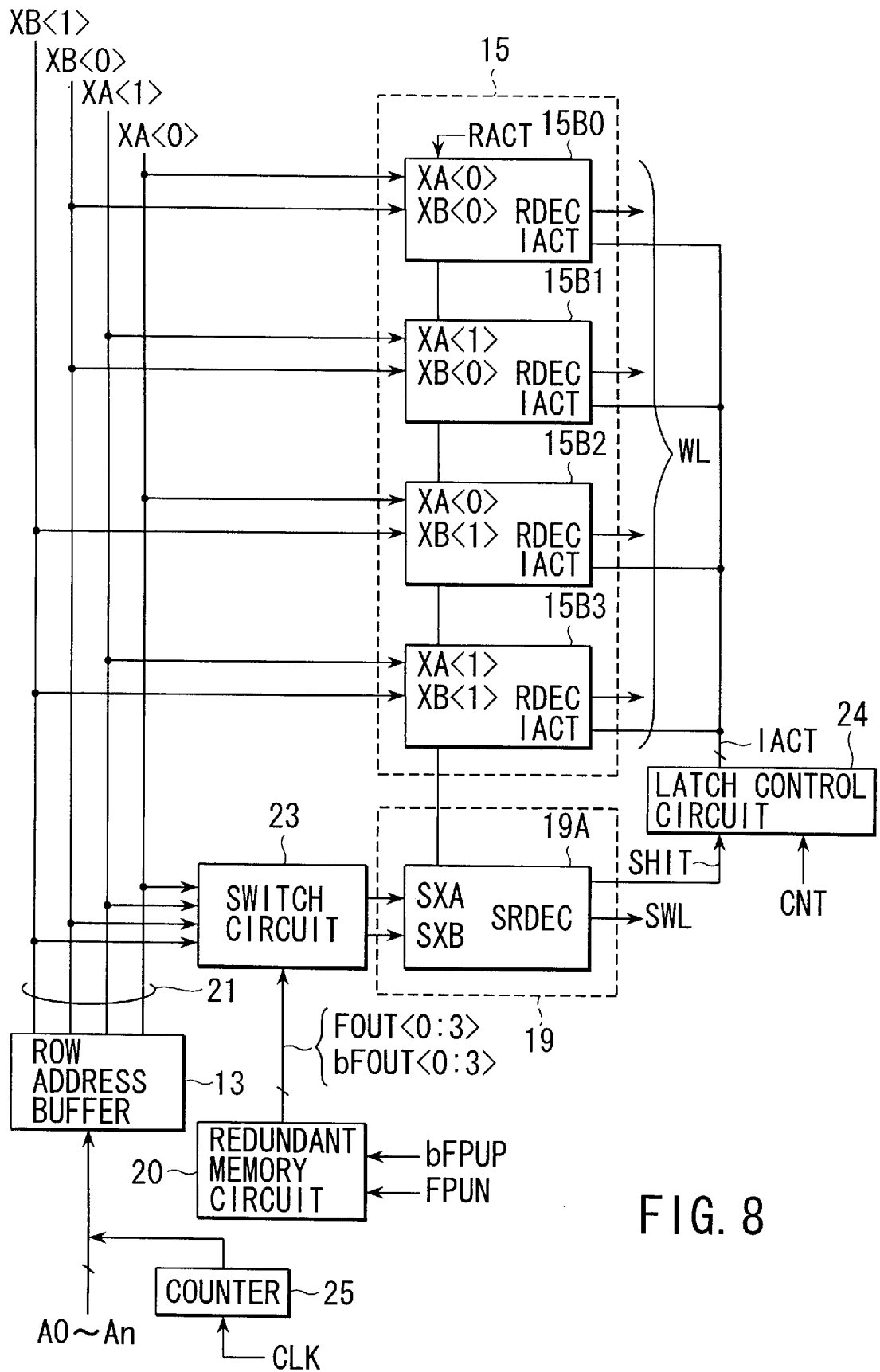
FIG. 8 is a block diagram of a row redundant circuit according to a second embodiment of the present invention.

FIG. 8 shows the configuration of the row redundant circuit in a semiconductor memory device according to the second embodiment of the present invention. In FIG. 8, the same parts as those in the first embodiment are indicated by the same reference numerals and explanation of them will be omitted. Moreover, in the second embodiment, to simplify the explanation, a case where four row decoders and one spare row decoder are used will be explained. The present invention, however, may be applied to a case where three or fewer or five or more row decoders and two or more spare row decoders are used.

A row decoder 15 includes row decoder circuits 15B0 to 15B3 for selecting word lines WL in a memory cell array 11 according to row address signals XA<0:1> and XB<0:1>. A spare row decoder 19 has a spare row decoder circuit 19A for selecting a spare word line SWL in a spare cell array 12. A redundant memory circuit 20 stores defective row addresses.

A switch circuit 23 is controlled by the defective row address signals FOUT<0:3> and bFOUT<0:3> outputted from the redundant memory circuit 20. When being activated by the spare row address signal outputted from the switch circuit 23, the spare row decoder 19A outputs a spare hit signal SHIT. The spare hit signal SHIT is supplied to a latch control circuit 24.

A signal CNT indicating the row address count-up operation mode carried out immediately after the turning on of the power supply is also supplied to the latch control circuit 24. According to the spare hit signal SHIT and signal CNT, the latch control circuit 24 outputs a signal IACT for deactivating the row decoder circuit corresponding to a defective row address and supplies it to the corresponding one of the row decoder circuits 15B0 to 15B3.

A counter 25 is connected to the input terminal of the row address buffer 13. The counter 25 counts a clock signal CLK in the row address count-up operation mode and generates an address signal sequentially. The address signal is supplied to the row address buffer 13, which generates a row address signal sequentially according to the address signal. The operation of counting up the row address is carried out only after the power supply has been turned on, in order to deactivate the row decoder replaced with the spare row decoder.

Figure 9:
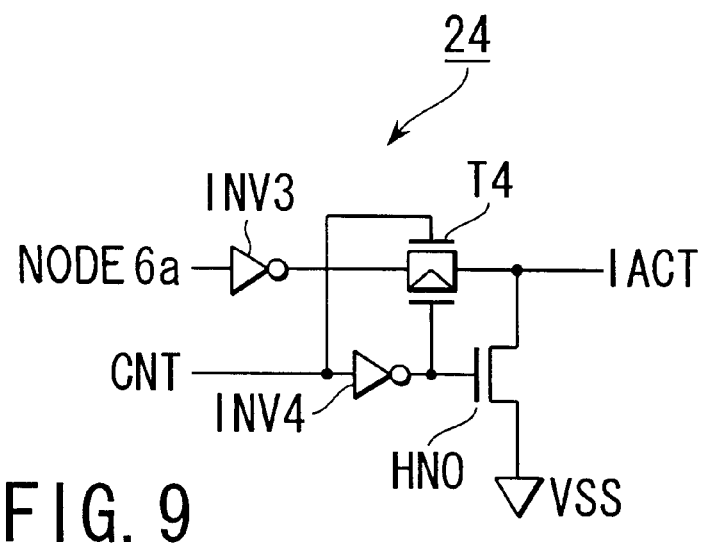
FIG. 9 is a circuit diagram of an example of the latch control circuit in FIG. 8.

FIG. 9 shows an example of the latch control circuit 24. The input terminal of an inverter circuit INV3 is connected to a node 6a in the spare row decoder 19A shown in FIG. 6. The output terminal of the inverter circuit INV3 is connected to the input terminal of a transfer gate T4. The output terminal of the transfer gate T4 outputs a deactivating signal IACT for deactivating the row decoder. The signal CNT indicating the row address count-up operation mode carried out after the turning on of the power supply is supplied to the gate of an n-channel MOS transistor constituting the transfer gate T4. The signal CNT is supplied via an inverter circuit INV4 to the gate of a p-channel MOS transistor. An n-channel MOS transistor HN0 is connected between the output terminal of the transfer gate T4 and the ground. The signal CNT inverted by the inverter circuit INV4 is supplied to the gate of the MOS transistor HN0. The MOS transistor HN0 prevents the wire for transmitting the deactivating signal IACT from going into the floating state.

Figure 10:
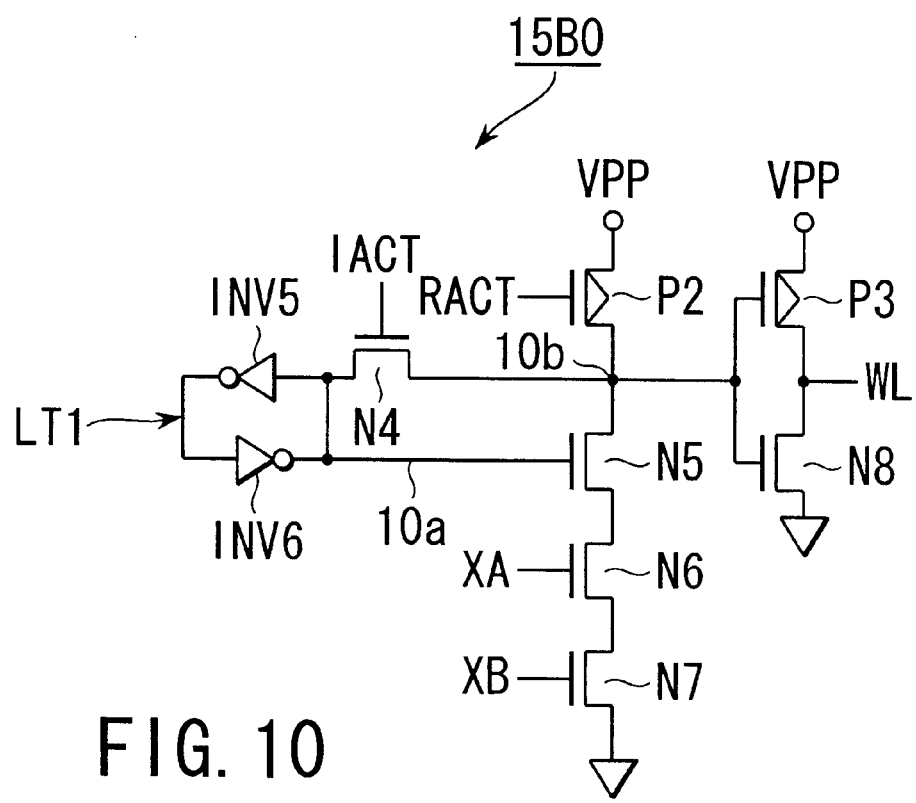
FIG. 10 is a circuit diagram of an example of the row decoder in FIG. 8.

FIG. 10 shows an example of the row decoder 15. In this example, to simplify the explanation below, only the row decoder circuit 15B0 corresponding to a single word line is shown. Actually, however, similar circuits are connected to all the word lines. The row address signals are combined to select a single word line.

The high power-supply potential VPP is supplied to the source of a p-channel MOS transistor P2, whose drain is connected to a node 10b. The row activating signal RACT is supplied to its gate. Between the node 10b and the ground, n-channel MOS transistors N5, N6, and N7 are connected in series. Row address signals XA and XB are supplied to the gates of the MOS transistors N6 and N7.

One end of the current path of an n-channel MOS transistor N4 is connected to the node 10b. The deactivating signal IACT outputted from the latch circuit 24 is supplied to the gate of the MOS transistor N4. A latch circuit LT1 is connected to the other end of the current path of the MOS transistor N4. A node 10a connected to the other end of the current path of the transistor N4 of the latch circuit LT1 is connected to the gate of the MOS transistor N5. The latch circuit LT1 is composed of inverter circuits INV5 and INV6 connected in parallel. In the latch circuit, the size of the transistors (not shown) constituting the inverter circuits INV5, INV6 is adjusted so that the initial value of the node 10a may be at the high level.

Further connected to the node 10b are the gate of a p-channel MOS transistor P3 and that of an n-channel MOS transistor N8. The high power-supply potential VPP is supplied to the source of the MOS transistor P3, whose drain is connected to the drain of the MOS transistor N8. The source of the MOS transistor N8 is connected to the ground. The drains of the MOS transistors P3 and N8 are connected to a specific single word line WL.

In the row decoder circuit 15B0 with the above configuration, the initial value at the node 10a in the latch circuit LT1 is at the high level. As a result, the internal row address signals XA, XB go high, turning on all the MOS transistors N5 to N7, which places the node 10b at the ground potential VSS. As a result, the MOS transistor P3 turns on, thereby supplying the high potential VPP to the word line WL.

In the above state, when the deactivating signal IACT outputted from the latch control circuit 24 goes high, turning on the MOS transistor N4, the storage state of the latch circuit LT1 is inverted. As a result, the node 10a goes low. Thereafter, when the deactivating signal IACT goes low, the load 10a is latched to the low level. Thus, even when the row address signals XA, XB are supplied, the row decoder circuit 15B is not selected and is deactivated. Specifically, when the row activating signal RACT goes low, with the MOS transistor N5 being off, the MOS transistor P3 turns off and the MOS transistor N8 turns on. Therefore, the ground potential VSS is applied to the word line.

Hereinafter, the semiconductor memory device according to the second embodiment will be explained.

In FIG. 8, when the signals bFPUP, FPUN are supplied to the redundant memory circuit 20 at the time of turning on the power supply as described earlier, the redundant memory circuit 20 outputs the defective row address signals FOUT<0:3> and bFOUT<0:3>. The defective row address signals FOUT<0:3> and bFOUT<0:3> are supplied to the switch circuit 23. According to the defective row address signals FOUT<0:3> and bFOUT<0:3>, the switch circuit 23 selects wires for transmitting either of row address signals XA<0:1> and either of row address signals XB<0:1>. The selected wires are connected to the input wires for the spare row address signals SXA, SXB of the spare row decoder circuit 19A.

Furthermore, when the power supply is turned on, the semiconductor memory device is set in the row address count-up operation mode, thereby deactivating the row decoder circuit corresponding to a defective row address. Specifically, when the row address count-up operation mode turns on, the signal CNT supplied to the latch control circuit 24 goes high, bringing the transfer gate T4 of FIG. 9 into the conducting state. As a result, the output terminal of the inverter circuit INV3 connected to the node 6a in the spare row decoder circuit 19A is connected via the transfer gate T4 to the gate of the MOS transistor N4 included in all the row decoder circuits 15B0 to 15B3. In this state, when the counter 25 generates an address signal according to the clock signal, the row address buffer 13 outputs a row address signal sequentially. When the spare row decoder circuit 19A is selected according to the row address signal, the node 6a goes low, activating the spare row decoder. As a result, the output signal from the inverter circuit INV3 of the latch control circuit 24 goes high, making the deactivating signal IACT high. Thus, the MOS transistor N4 in all the row decoder circuits 15B0 to 15B3 turns on.

In the row decoder circuit to be replaced with which has been activated simultaneously with the spare row decoder circuit 19A according to the row address signal, the MOS transistors N6, N7 turn on according to the row address signals XA, XB. As a result, the node 10b goes low and the node 10a also goes low. Thus, the MOS transistor N5 turns off. When the row address is counted up to the next value, the spare row decoder circuit 19A is deactivated. As a result, the deactivating signal IACT goes low, turning off the MOS transistor N4, which latches the level at the node 10a in the latch circuit LT1.

As described above, in the row address count-up operation mode, the low level signal is latched in the latch circuit LT1 of the row decoder circuit 15B corresponding to the defective row address, thereby deactivating the row decoder circuit 15B. Thus, when the row address signals XA<0:1>, XB<0:1> generated by the row address buffer 13 correspond to the defective row address signal, the spare row decoder circuit is selected according to the row address signal, thereby activating the spare word line. The row decoder circuit replaced with the spare row decoder circuit is not selected even when the row address signal is supplied to the row decoder circuit, because the MOS transistor N5 is in the off state.

With the second embodiment, the wire for transmitting the row address signal is connected with the spare row decoder according to the defective row address at the time of turning on the power supply. At the same time, all the row addresses are counted up and the latch control circuit 24 inverts the output signal of the latch circuit LT1 provided in the row decoder circuit corresponding to the defective row address, thereby deactivating the row decoder circuit corresponding to the defective row address. Therefore, differently from a conventional equivalent, there is no need to compare the row address signal with the defective row address each time a row address signal is generated. This enables a high-speed operation.

Furthermore, since the second embodiment is constructed without using the row decoder deactivating circuit and the wire for transmitting row decoder activating signals FX<0:3> as in the first embodiment, it has the advantage of suppressing an increase in the circuit area.

<Third Embodiment>

Figure 11:
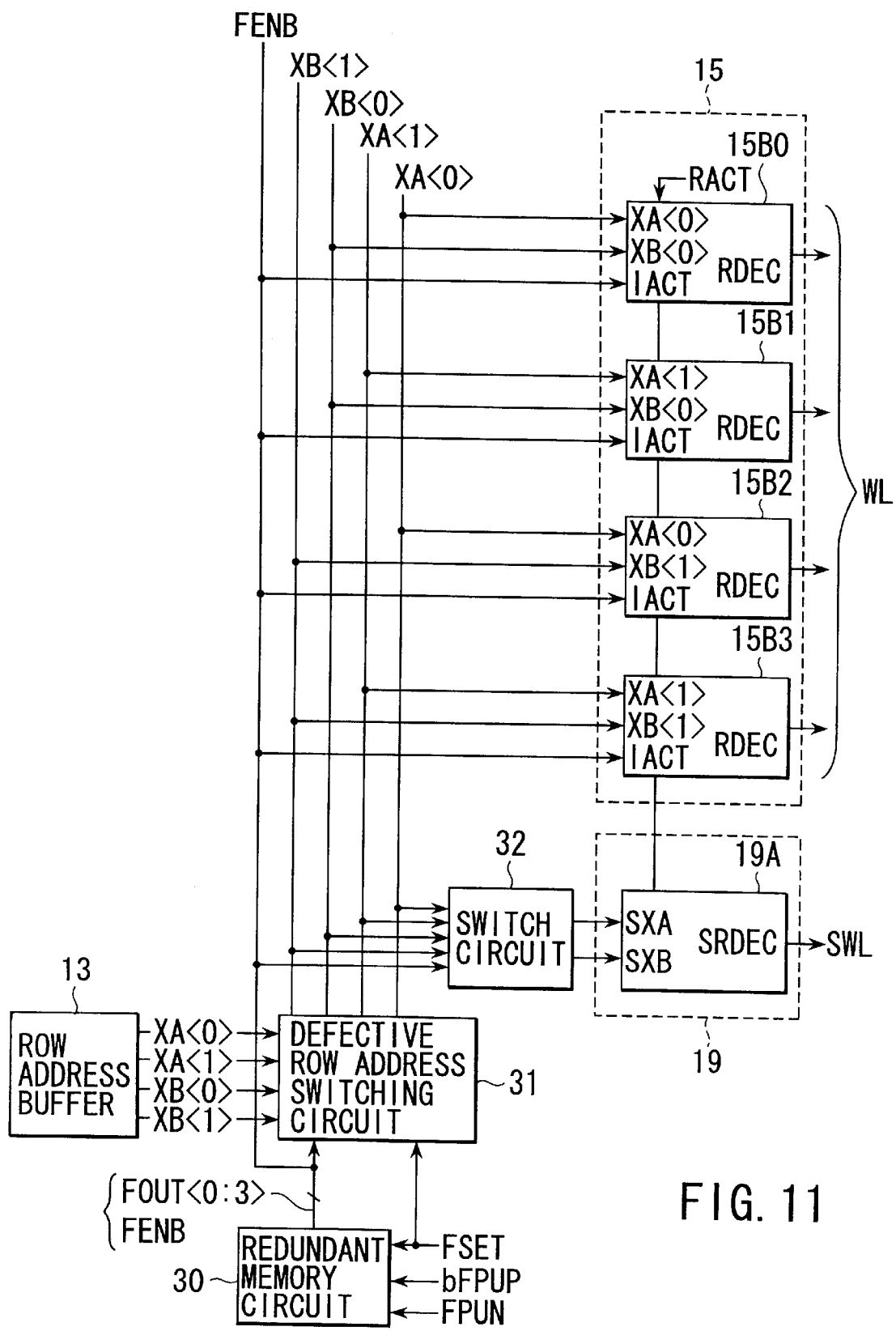
FIG. 11 is a block diagram of a row redundant circuit according to a third embodiment of the present invention.

FIG. 11 shows a third embodiment of the present invention.

In the first and second embodiments, there have been many wires between the redundant memory circuit 20 and the switch circuit 23, making it necessary to arrange the redundant memory circuit and switch circuit next to each other. In contrast, in the third embodiment, the necessary information for redundancy switching is latched in a latch circuit according to the output signal from the redundant memory circuit at the time of turning of the power supply. Use of such a configuration makes it possible to decrease the number of wires between the redundant memory circuit and switch circuit. Furthermore, the third embodiment realizes a similar function to that of the second embodiment without arranging the redundant memory circuit adjacent to the switch circuit.

In FIG. 11, the same parts as those in FIG. 8 are indicated by the same reference numerals and the parts different from the second embodiment will be explained.

In FIG. 11, a redundant memory circuit 30 stores information as to whether or not a defective row address and a redundant circuit are in use. According to signals bFPUP, FPUN and a redundancy set signal FSET supplied at the time of turning on the power supply, the redundant memory circuit 30 outputs a fuse enable signal FENB indicating whether or not the defective row address signals F<0:3> and redundant circuit are in use.

A defective row address switching circuit 31 switches from the row address buffer 13 to the redundant memory circuit 30 according to the redundancy set signal FSET, thereby outputting the defective row address signal supplied from the redundant memory circuit 30.

According to the fuse enable signal FENB, a switch circuit 32 latches the defective row address signal supplied from the defective row address switching circuit 31 in a latch circuit explained later. The defective row address signal latched in the latch circuit switches between the wire for transmitting the row address signals XA<0:1>, XB<0:1> and the wire for supplying the spare row address signals SXA, SXB to a spare row decoder circuit 19A.

The fuse enable signal FENB and the defective row address signal supplied from the defective row address switching circuit 31 are supplied to row decoder circuits 15B0 to 15B3 in the redundancy set operation mode. These row decoder circuits 15B0 to 15B3 use the fuse enable signal FENB and defective row address signal to deactivate the row decoder circuit corresponding to the defective row address signal.

Figure 12A:
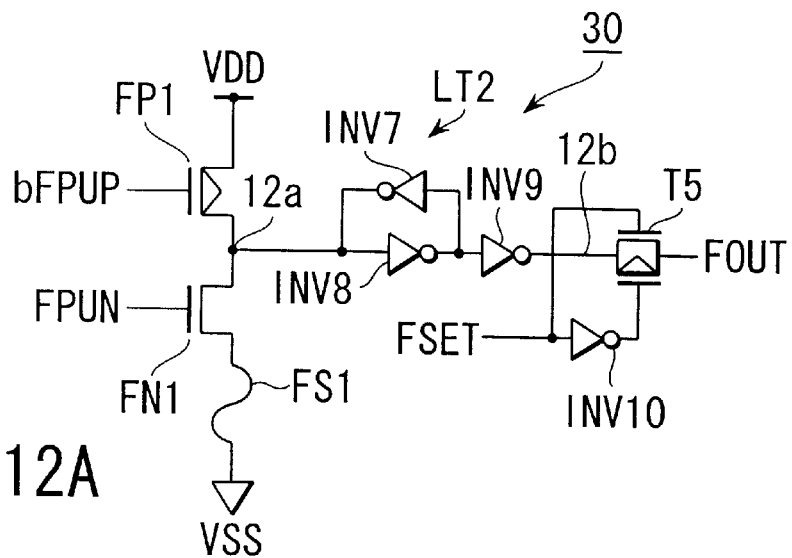
FIG. 12A is a circuit diagram of an example of the redundant memory circuit in FIG. 11.
Figure 12B:
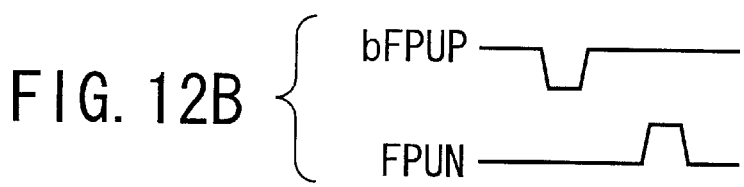
FIG. 12B is a waveform diagram of the input signal in FIG. 12A.

FIG. 12A is a circuit diagram of an example of the redundant memory circuit 30, showing a memory circuit for a defective row address. FIG. 12B shows an input signal in FIG. 12A. In this example, to simplify the explanation below, only the redundant memory circuit corresponding to a single row address signal is shown. Actually, however, there are as many redundant memory circuits as there are row address signals.

In FIG. 12A, a high power-supply potential VDD is supplied to the source of a p-channel MOS transistor FP1, whose drain is connected to a node 12a. The signal bFPUP is supplied to its gate. Between the node 12a and the ground, an n-channel MOS transistor FN1 and a memory element fuse FS1 are connected in series. The signal FPUN is supplied to the gate of the n-channel MOS transistor FN1. One end of a latch circuit LT2 composed of two inverter circuits INV7 and INV8 is connected to the node 12a. To the other end of the latch circuit LT2, one end of a transfer gate T5 is connected via an inverter circuit INV9. The other end of the transfer gate T5 outputs a defective row address signal FOUT. A redundancy set signal FSET explained later is supplied to the gate of an n-channel MOS transistor constituting the transfer gate T5. A redundancy set signal FSET is supplied via an inverter circuit INV10 to the gate of a p-channel MOS transistor.

With the above configuration, when the power supply is turned on, the signals bFPUP and FPUN as shown in FIG. 12B are externally supplied to the gate of the MOS transistor FP1 and that of the MOS transistor FN1, respectively. When the signal bFPUP is supplied to the gate of the MOS transistor FP1, the node 12a is charged to the high level. Then, when the signal FPUN is supplied to the gate of the MOS transistor FN1, if the fuse FS1 has been blown, the node 12a goes high. As a result, the high level is outputted to the node 12b serving as the output terminal of the inverter circuit INV9. In the redundancy set operation mode carried out after the turning on of the power supply, the redundancy set signal FSET is made high, which causes the potential at the node 12b to be outputted from the transfer gate T5 as the defective row address signal FOUT.

Figure 12C:
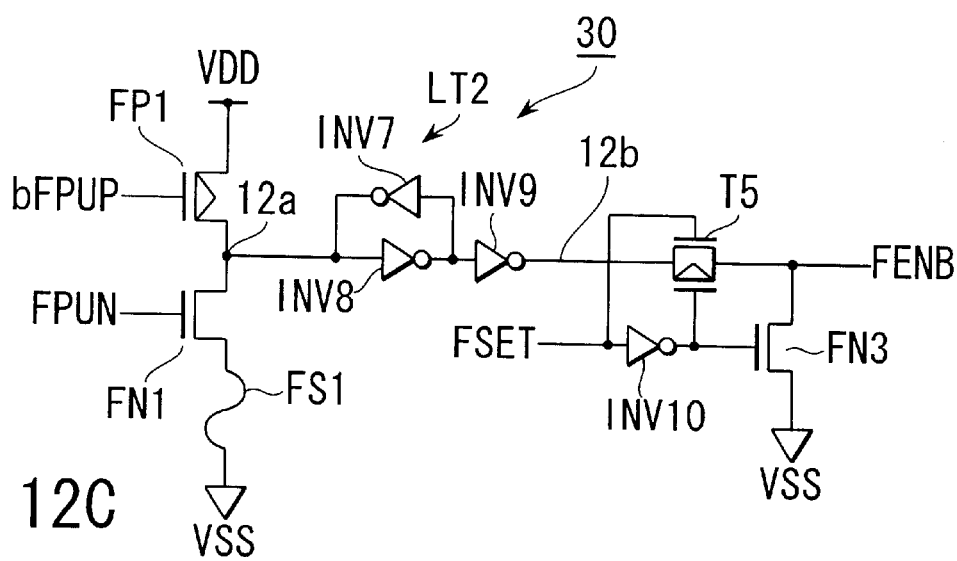
FIG. 12C is a circuit diagram of another example of the redundant memory circuit.

FIG. 12C is a circuit diagram of a memory circuit for storing information as to whether or not the fuse in the redundant memory circuit 30 is in use. Because the circuit is almost the same as that of FIG. 12A, the same parts as those in FIG. 12A are indicated by the same reference numerals and only the parts different from those in FIG. 12A will be explained. In the circuit, an additional n-channel MOS transistor FN3 is connected between the output end of the transfer gate T5 and the ground. The signal FSET inverted by the inverter circuit INV1O is supplied to the gate of the MOS transistor FN3.

In the circuit of FIG. 12C, when the fuse in the redundant memory circuit 30 is in use, the fuse FS1 is blown. As a result, when information on the fuse FS1 is read using the signals bFPUP, FPUN in the operation of turning on the power supply and the transfer gate is made conducting by the redundancy set signal FSET, the high fuse enable signal FENB is outputted. Thereafter, when the redundancy set signal FSET is made low, this turns on the MOS transistor FN3, making the fuse enable signal FENB low.

Figure 13:
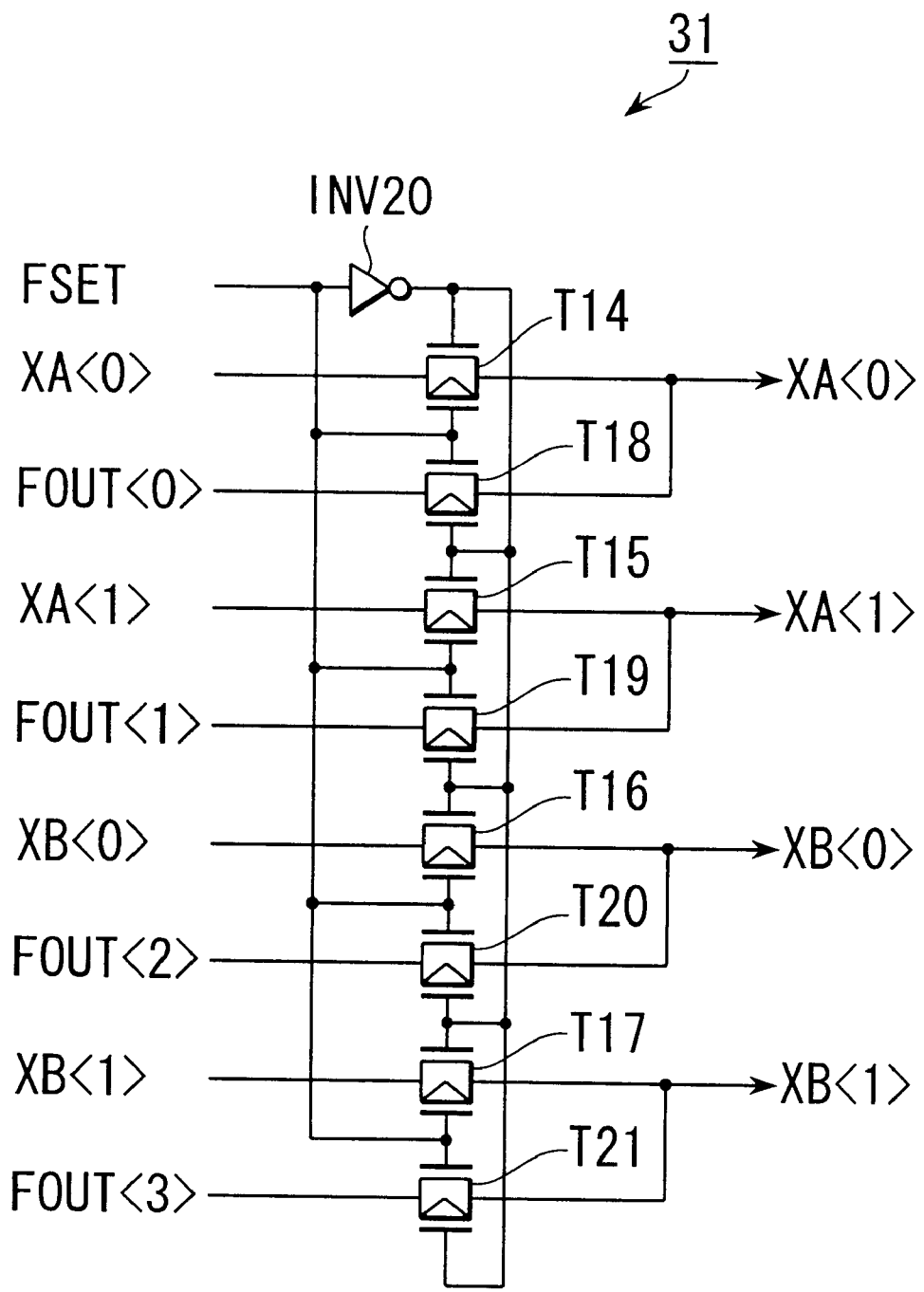
FIG. 13 is a circuit diagram of an example of the defective row address switching circuit in FIG. 11.

FIG. 13 shows an example of the defective row address switching circuit 31. The row address signals XA<0:1>, XB<0:1> outputted from the row address buffer 13 are supplied to one end sides of transfer gates T14 to T17. The defective address signal FOUT<0:3> from the redundant memory circuit 30 is supplied to one end sides of transfer gates T18 to T21. The other end sides of the transfer gates T14 to T17 are connected to the other end sides of the transfer gates T18 to T21, respectively. Row address signals XA<0:1>, XB<0:1> are outputted from the other end sides of the transfer gates T14 to T17.

The redundancy set signal FSET is supplied via the inverter INV 20 to the gates of the n-channel MOS transistors constituting the transfer gates T14 to T17 and the gates of the p-channel MOS transistors constituting the transfer gates T18 to T21. Moreover, the redundancy set signal FSET is supplied to the gates of the p-channel MOS transistors constituting the transfer gates T14 to T17 and the gates of the n-channel MOS transistors constituting the transfer gates T18 to T21.

The redundancy set signal FSET is used to latch redundancy information in the switch circuit 32 and each row decoder circuit 15B only when the power supply is turned on. The redundancy set signal FSET is normally at the low level, which brings the transfer gates T14 to T17 in the conducting state. On the other hand, when the redundancy set signal FSET goes high, the transfer gates T14 to T17 are made nonconducting and the transfer gates T18 to T21 are made conducting. As a result, the defective row address signals FOUT<0:3> from the redundant memory circuit 30 are outputted as row address signals XA<0:1>, XB<0:1> via the transfer gates T18 to T21.

Figure 14:
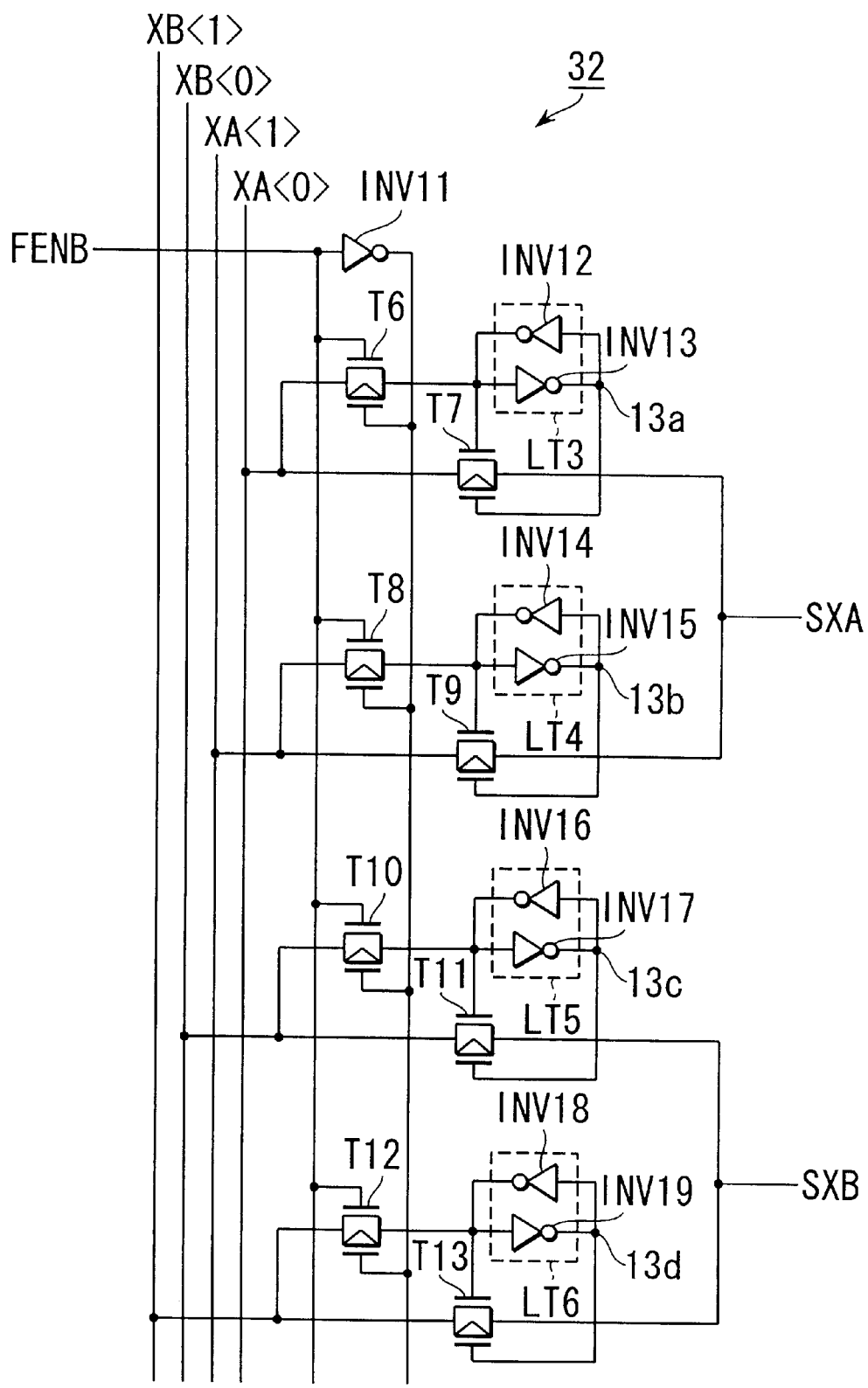
FIG. 14 is a circuit diagram of an example of the switch circuit in FIG. 11.

FIG. 14 shows an example of the switch circuit 32. The row address signals XA<0:1>, XB<0:1> outputted from the defective row address switching circuit 31 are supplied to the input terminals of the transfer gates T7, T9, T11, and T13. The output terminals of the transfer gates T7 and T9 are connected to each other and the output terminals of the transfer gates T11 and T13 are connected to each other. Spare row address signals SXA, SXB are outputted from these output terminals.

To the transfer gates T7, T9, T11, and T13, latch circuits LT3, LT4, LT5, and LT6 for holding the conducting states or nonconducting states of the respective transfer gates are connected. Specifically, the input terminals of the latch circuits LT3, LT4, LT5, and LT6 are connected to the gates of the n-channel MOS transistors constituting the respective transfer gates T7, T9, T11, and T13. The output terminals of the latch circuits LT3, LT4, LT5, and LT6 are connected to the gates of the p-channel MOS transistors constituting the respective transfer gates T7, T9, T11, and T13. The latch circuit LT3 is composed of inverter circuits INV12 and INV13. The latch circuit LT4 is composed of inverter circuits INV14 and INV15. The latch circuit LT5 is composed of inverter circuits INV16 and INV17. The latch circuit LT6 is composed of inverter circuits INV18 and INV19.

Between the input terminals of the latch circuits LT3, LT4, LT5, and LT6 and the input terminals of the transfer gates T7, T9, T11, and T13, transfer gates T6, T8, T10, and T12 are connected respectively. The fuse enable signal FENB is supplied to the gates of the n-channel MOS transistors constituting the transfer gates T6, T8, T10, and T12, whereas the fuse enable signal FENB is supplied via an inverter circuit INV11 to the gates of the p-channel transistors. According to the fuse enable signal FENB, these transfer gates T6, T8, T10, and T12 supply the row address signals XA<0:1>, XB<0:1> to the respective latch circuits LT3, LT4, LT5, and LT6.

In the latch circuits LT3, LT4, LT5, and LT6, the size of the transistors constituting the respective inverter circuits has been adjusted in such a manner that the initial values at the output terminals (nodes) 13a, 13b, 13c, and 13d are at the high level. As a result, the initial states of the transfer gates T7, T9, T11, and T13 are in the nonconducting state.

In the switch circuit 32, when the fuse enable signal FENB goes high, the transfer gates T6, T8, T10, and T12 become conducting, which connects the row address signals XA<0:1>, XB<0:1> to the latch circuits LT3, LT4, LT5, and LT6. In this state, for example, when the row address signal XA<0> is at the high level, the transfer gate T7 is made conducting via the transfer gate T6, which causes the row address signal XA<0> to be outputted as a spare address signal SXA. When the row address signal XA<0> is at the low level, the transfer gate T7 remains nonconducting.

Thereafter, when the fuse enable signal FENB goes low, the transfer gates T6, T8, T10, and T12 become nonconducting, which causes the states of the transfer gates T7, T9, T11, and T13 to be held in the latch circuits LT3, LT4, LT5, and LT7. In this way, the switch circuit 32 is set in such a manner that it permits only the defective address signal supplied from the row address buffer to pass through.

Hereinafter, the operation of the third embodiment will be explained.

In FIG. 11, when the signals bFPUP, FPUN are externally supplied to the redundant memory circuit 30 at the time of the turning on of the power supply, the defective row address is latched in the latch circuit LT2 in the redundant memory circuit 30. Thereafter, the redundancy set operation is carried out, thereby switching the switch circuit 32 and deactivating the row decoders 15B0 to 15B3 corresponding to the defective row addresses.

Specifically, when the redundancy set operation mode is turned on, the redundancy set signal FSET is made high. As a result, the transfer gates T18, T19, T20, and T21 in the defective row address switching circuit 31 become conducting, which causes the defective row address signals FOUT<0:3> outputted from the redundant memory circuit 30 to be outputted as the row address signals XA<0:1>, SB<0:1>. The defective row address signals FOUT<0:3> outputted from the defective row address switching circuit 31 are supplied to the switch circuit 32 and row decoder circuits 15B0 to 15B3.

Since in the switch circuit 32, the fuse enable signal FENB is at the high level, the transfer gates T6, T8, T10, and T12 become conducting. When the row address signals XA<0:1>, XB<0:1> as the defective row address signals FOUT<0:3> are at the high level, the potentials at the output terminals 13a, 13b, 13c, and 13d of the latch circuits LT3, LT4, LT5, and LT6 are inverted via the transfer gates T6, T8, T10, and T12, which makes any one of the transfer gates T7, T9, T11, and T13 conducting.

The row decoder circuits 15B0 to 15B3 are deactivated so that the row decoder circuit corresponding to the defective row address may not be selected according to the fuse enable signal FENB. Because this operation is the same as in the second embodiment explained in FIG. 10, its explanation will be omitted. In this case, the fuse enable signal FENB is supplied to the gate of the MOS transistor N4 of FIG. 10 instead of the signal IACT.

When the redundancy set signal FSET goes low, the transfer gates T18, T19, T20, and T21 in the defective row address switching circuit 31 are made nonconducting and the transfer gates T14, T15, T16, and T17 are made conducting. As a result, the redundant memory circuit 30 is disconnected from the defective row address switching circuit 31. Then, the row address buffer 13 is connected to the defective row address switching circuit 31. Furthermore, the transfer gates T6, T8, T10, and T12 in the switch circuit 32 are made nonconducting, which disconnects the latch circuits LT3 to LT6 from the wire for transmitting the row address signals XA<0:1>, XB<0:1>.

In the normal operation, when the row address buffer 13 generates the row address signals XA<0:1>, XB<0:1>, these row address signals are supplied via the defective row address switching circuit 31 to the switch circuit 32 and row decoder circuits 15B0 to 15B3. The row address signal supplied to the switch circuit 32 is supplied to the spare row decoder circuit 19A, which decodes the row address signal. When the row address signal supplied to the spare row decoder circuit 19A corresponds to the defective row address signal, the spare word line is activated. In addition, even when the defective row address signal is supplied to the row decoder circuit replaced with the spare row decoder circuit 19A, the row decoder circuit will never be selected because the MOS transistor N5 of the row decoder is in the off state.

With the third embodiment, the latch circuits LT3 to LT6 are provided in the switch circuit 32. The output signals of the latch circuits are inverted according to the defective row address signal outputted from the redundant memory circuit 30 at the time of turning on the power supply and supplied via the defective row address switching circuit 31 to the switch circuit 32, which enables the row decoder circuit to be replaced with the spare row decoder. Therefore, as compared with the first and second embodiments, the number of wires between the redundant memory circuit and the switch circuit is decreased and the redundant memory circuit and switch circuit are arranged without placing them next to each other. As a result, the third embodiment has the advantage of increasing the degree of freedom in the layout of the redundant memory circuit.

Furthermore, the redundant memory circuit 30 and defective row address switching circuit 31 can be arranged in such a manner that they are separate from the switch circuit 32. This makes it possible to place these circuits around, for example, the chip whose layout has room, which prevents the chip area from increasing.

In the second embodiment, the spare row decoder 19, redundant memory circuit 20, and switch circuit 23 forms a unit. Thus, for example, when the number of spare row decoders is increased, the number of redundant memory circuits and that of switch circuits are also increased accordingly. This causes the problem of permitting the occupied area on the chip to increase. In contrast, with the third embodiment, even when the number of spare row decoders is increased, this increase can be dealt with by increasing the number of redundant memory circuits 30 accordingly. Specially, the added redundant memory circuits 30 are connected to the defective row address switching circuit 31.

Then, these redundant memory circuits 30, defective row address switching circuits 31, switch circuit 32, and row decoder circuits 15B0 to 15B3 have only to be controlled sequentially by separate redundancy set signals FSET<0:1>. Therefore, the third embodiment prevents an increase in the chip area caused by an increase in the number of spare row decoders.

Furthermore, in the third embodiment, the counter need not count up the row address as in the second embodiment. This makes it faster to set redundancy switching.

<Fourth Embodiment>

Figure 15:
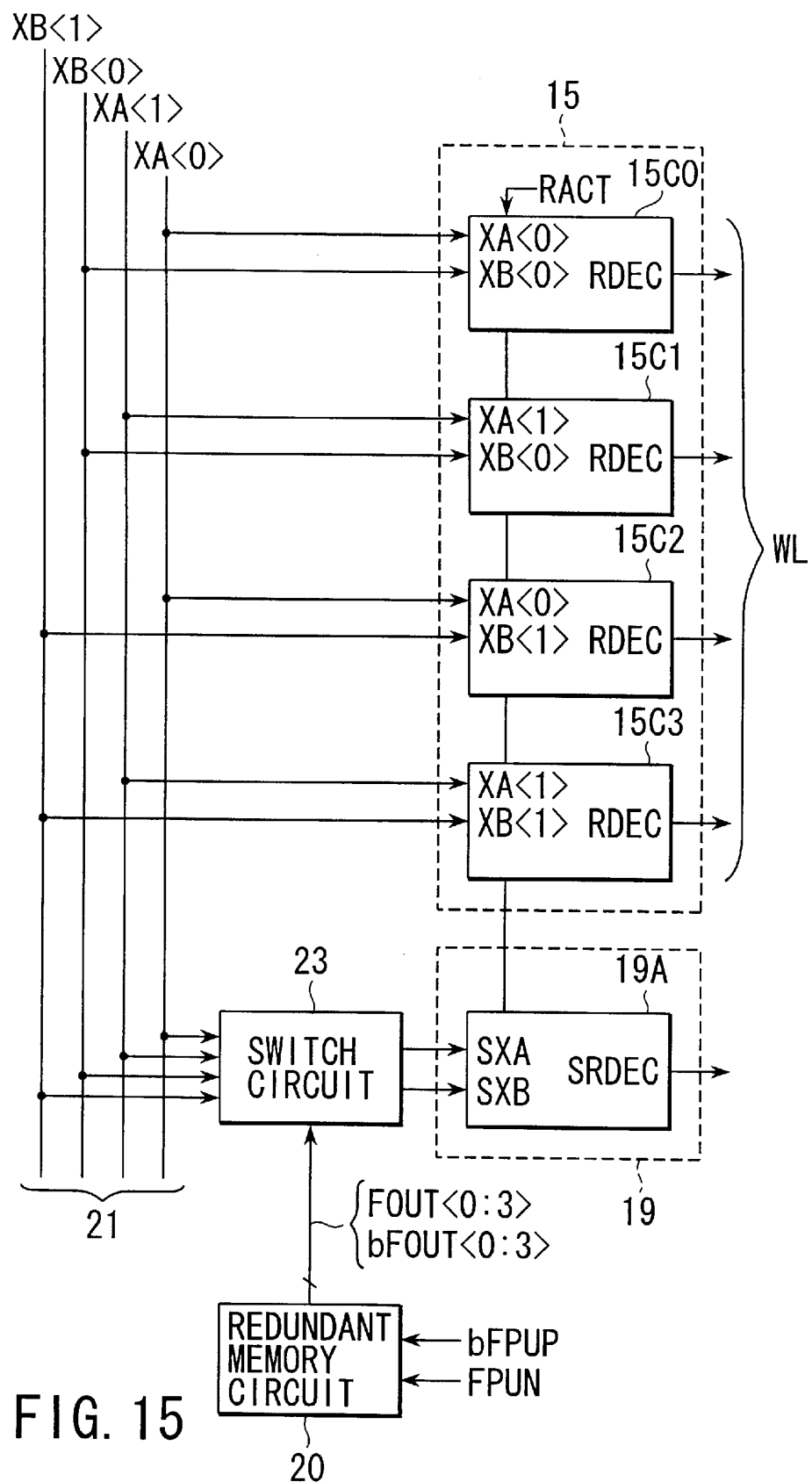
FIG. 15 is a block diagram of a row redundant circuit according to a fourth embodiment of the present invention.

FIG. 15 shows a fourth embodiment of the present invention.

In the second embodiment, the latch circuit LT1 and MOS transistor N5 have been provided in the row decoder circuit 15B of FIG. 10. They have been used to deactivate the row decoder circuit replaced with the spare row decoder circuit. In contrast, the fourth embodiment realizes a similar function by using a fuse element instead of the MOS transistor N5.

In FIG. 15, the same parts as those in FIG. 8 are indicated by the same reference numerals and the parts different from FIG. 8 will be explained. That is, FIG. 15 differs from FIG. 8 in the configuration of the row decoder circuits 15C0 to 15C3 and in that it does not require the counter 25.

Figure 16:
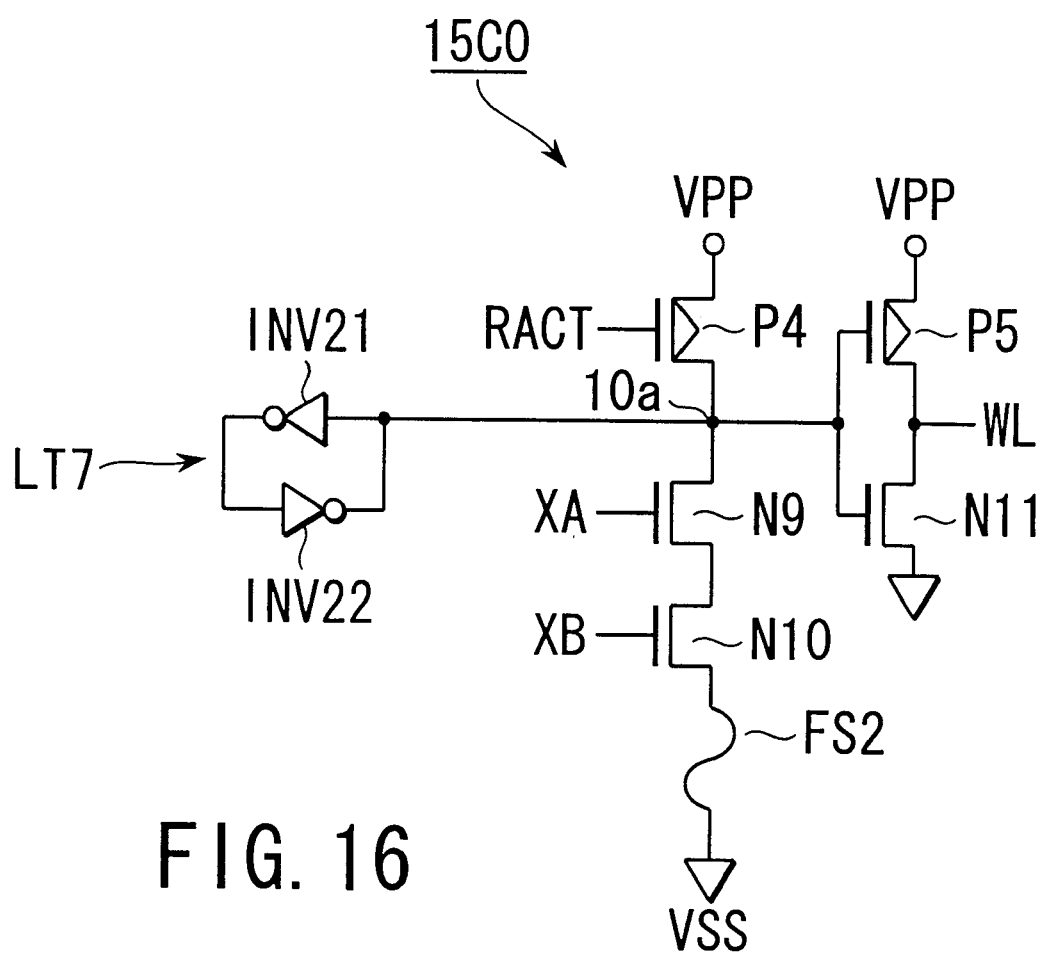
FIG. 16 is a circuit diagram of an example of the row decoder circuit in FIG. 15.

FIG. 16 shows an example of the row decoder 15. In this example, to simplify the explanation below, only the row decoder circuit 15C0 corresponding to a single word line is shown. Actually, however, similar circuits are connected to all the word lines and the row address signals are combined to select a single word line.

In FIG. 16, the high power-supply potential VPP is supplied to the source of a p-channel MOS transistor P4, whose drain is connected to a node 16a. The row activating signal RACT is supplied to its gate. Between the node 16a and the ground, n-channel MOS transistors N9 and N10 and a fuse FS2 are connected in series. The row address signals XA, XB are supplied to the gates of the MOS transistors N9, N10, respectively.

A latch circuit LT7 is connected to the node 16a. The latch circuit LT7 is composed of inverter circuits INV21, INV22 connected in parallel. In the latch circuit, the size of the transistors (not shown) constituting the inverter circuits INV21, INV22 has been adjusted in such a manner that the initial value at the node 16a is at the high level.

The gate of a p-channel MOS transistor P5 and that of an n-channel MOS transistor N11 are connected to the node 16a. The high power-supply potential VPP is supplied to the source of the MOS transistor P5, whose drain is connected to the drain of the MOS transistor N11. The source of the MOS transistor N11 is grounded. The drains of the MOS transistors P5, N11 are connected to a specific single word line WL.

In the row decoder 15C with the above configuration, in a case where the fuse FS2 has not been blown, when the row address signals XA, XB go high and the MOS transistors N9, N10 turn on, the MOS transistor P5 turns on, causing the high potential VPP to be supplied to a word line WL. Moreover, when at least one of the MOS transistors N9, N10 is off, or when the row activating signal RACT goes low, the MOS transistor P5 turns off and the MOS transistor N11 turns on. As a result, the ground potential VSS is supplied to the word line WL.

On the other hand, in a case where the fuse FS2 has been blown, even when the row address signals XA, XB go high and the MOS transistors N9, N10 turn on, the potential at the node 16a is at the power-supply potential VPP. As a result, the MOS transistor N11 turns on, thereby supplying the ground potential VSS to the word line WL.

With the above configuration, the operation of the fourth embodiment will be explained.

First, when the result of the initial test (for example, die sort test) has shown that there is a defective memory cell in the memory cell array, a specific fuse in the redundant memory circuit is blown by, for example, a laser, and the defective row address for selecting the defective memory cell is stored. Then, the fuse FS2 in the row decoder circuit to select the defective memory cell is blown, preventing the row decoder circuit from being activated.

When the signals bFPUP, FPUN are supplied to the redundant memory circuit 20 as described above at the time of turning on the power supply, the redundant memory circuit 20 outputs the defective row address signals FOUT<0:3>, bFOUT<0:3>. The defective row address signals FOUT<0:3>, bFOUT<0:3> are supplied to the switch circuit 23. According to the defective row address signals FOUT<0:3>, bFOUT<0:3> supplied, the switch circuit 23 selects either of the row address signals XA<0:1> or either of the row address signals XB<0:1> and enables them to be inputted as the spare row address signals SXA, SXB to the spare row decoder circuit 19A.

Therefore, in an actual operation, when the row address buffer 13 generates the row address signals XA<0:1>, XB<0:1>, these row address signals are supplied via the transfer gate of the switch circuit directly to the spare row decoder circuit 19A, which decodes the row address signal. When the row address signal corresponds to the defective row address, the spare word line SWL is activated. Even when the defective row address signal is supplied to the row decoder circuit replaced with the spare row decoder circuit 19A, the row decoder circuit will never be selected.

With the fourth embodiment, the fuse FS2 is provided in each of the row decoder circuits 15C0 to 15C3. According to the result of the initial test, the fuse FS2 in the row decoder circuit corresponding to the defective memory cell is blown, thereby preventing the row decoder circuit from being activated. As a result, when the power supply is turned on, the switch circuit 23 has only to allocate a defective row address to the spare row decoder circuit 19A. Because the row decoder circuit is deactivated according to the defective row address, complex control is not necessary, which speeds up the setting operation when the power supply is turned on, as compared with the second embodiment.

Furthermore, since the number of elements used in the row decoder circuit is decreased, suppressing an increase in the chip area, which shortens the access time more.

<Fifth Embodiment>

Figure 17:
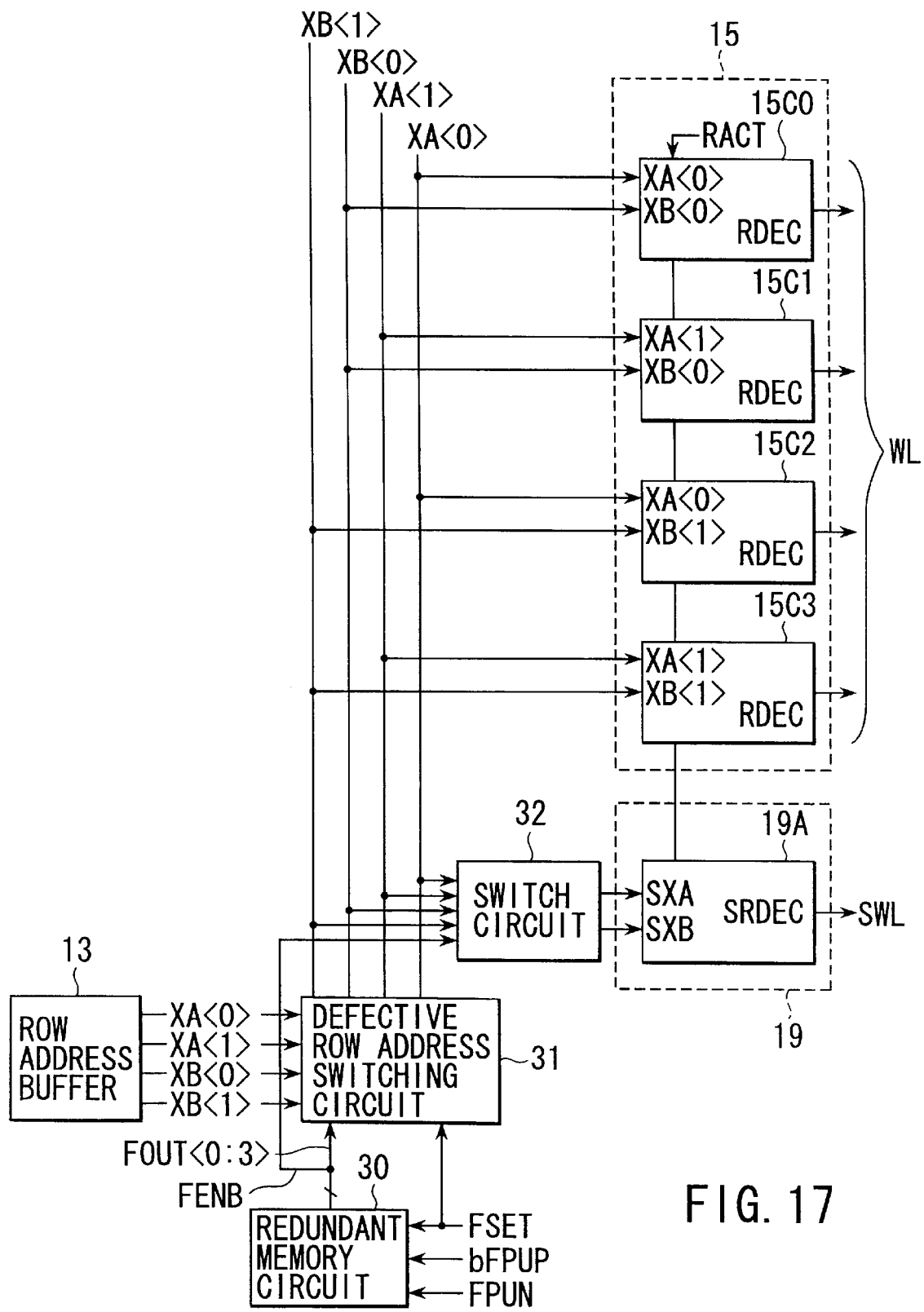
FIG. 17 is a block diagram of a row redundant circuit according to a fifth embodiment of the present invention.

FIG. 17 shows a fifth embodiment of the present invention.

In the third embodiment of FIG. 11, the latch circuit and MOS transistor N5 have been used in the row decoder circuit, thereby deactivating the row decoder circuit replaced with the spare row decoder circuit. In contrast, the fifth embodiment realizes a similar function by using a fuse element instead of the MOS transistor N5.

Specifically, the fifth embodiment is a modification of the third embodiment. As shown in FIG. 17, instead of the row decoder circuits 15B0 to 15B3 of FIG. 11, the row decoder circuits 15C0 to 15C3 of FIG. 15 are used. Each of the row decoder circuits 15C0 to 15C3 has a fuse FS2. The fuse FS2 is blown according to the position of a defective memory cell. As a result, it is not necessary to supply the fuse enable signal FENB to the row decoder circuits 15C0 to 15C3 as shown in FIG. 11. Because the remaining circuit configuration is the same as that of FIG. 11, the same parts are indicated by the same reference numerals.

With the above configuration, the operation of the fifth embodiment will be explained.

First, when the result of the initial test (for example, die sort test) has shown that there is a defective memory cell in the memory cell array, a specific fuse in the redundant memory circuit is blown by, for example, a laser, and the defective row address for selecting the defective memory cell is stored. Then, the fuse FS2 in the row decoder circuit to select the defective memory cell is blown, preventing the row decoder circuit from being activated.

When the signals bFPUP, FPUN are externally supplied to the redundant memory circuit 30 at the time of turning on the power supply, the defective row address is latched in the latch circuit LT2 of the redundant memory circuit 30. Thereafter, a redundancy set operation is carried out, which switches the switch circuit 32 and deactivates the row decoder circuit 15B0 to 15B3 corresponding to the defective row address.

Specifically, when the redundancy set operation mode is turned on, the redundancy set signal FSET is made high. As a result, the transfer gates T18, T19, T20, and T21 in the defective row address switching circuit 31 become conducting, which allows the defective row address signals FOUT<0:3> outputted from the redundant memory circuit 30 to be outputted as the row address signals XA<0:1>, XB<0:1>. The defective row address signals FOUT<0:3> outputted from the defective row address switching circuit 31 are supplied to the switch circuit 32.

Because the fuse enable signal FENB is at the high level, the transfer gates T6, T8, T10, and T12 in the switch circuit 32 are made conducting. When the row address signals XA<0:1>, XB<0:1> serving as the defective row address signals FOUT<0:3> are at the high level, the potentials at the output terminals 13a, 13b, 13c, and 13d of the latch circuits LT3, LT4, LT5, and LT6 are inverted via the transfer gates T6, T8, T10, and T12, which makes any one of the transfer gates T7, T9, T11, and T13 conducting.

In a normal operation, when the row address buffer 13 generates the row address signals XA<0:1>, XB<0:1>, these row address signals are supplied via the defective row address switching circuit 31 to the switch circuit 32 and row decoder circuits 15B0 to 15B3. The row address signal supplied to the switch circuit 32 is supplied to the spare row decoder circuit 19A, which decodes the row address signal. When the row address signal supplied to the spare row decoder circuit 19A corresponds to the defective row address, the spare word line is activated. Even when the defective row address signal is supplied to the row decoder circuit replaced with the spare row decoder circuit 19A, the row decoder circuit will never be selected because its fuse has been blown.

With the fifth embodiment, the fuse FS2 is provided in each of the row decoder circuits 15C0 to 15C3. According to the result of the initial test, the fuse FS2 in the row decoder circuit corresponding to the defective memory cell is blown, thereby preventing the row decoder circuit from being activated. As a result, when the power supply is turned on, the switch circuit 32 has only to allocate a defective row address to the spare row decoder circuit 19A. Because the row decoder circuit is deactivated according to the defective row address, complex control is not necessary, which speeds up the setting operation when the power supply is turned on, as compared with the third embodiment.

Furthermore, since the number of elements used in the row decoder circuit is decreased, suppressing an increase in the chip area, which shortens the access time more.

<Sixth Embodiment>

Figure 18:
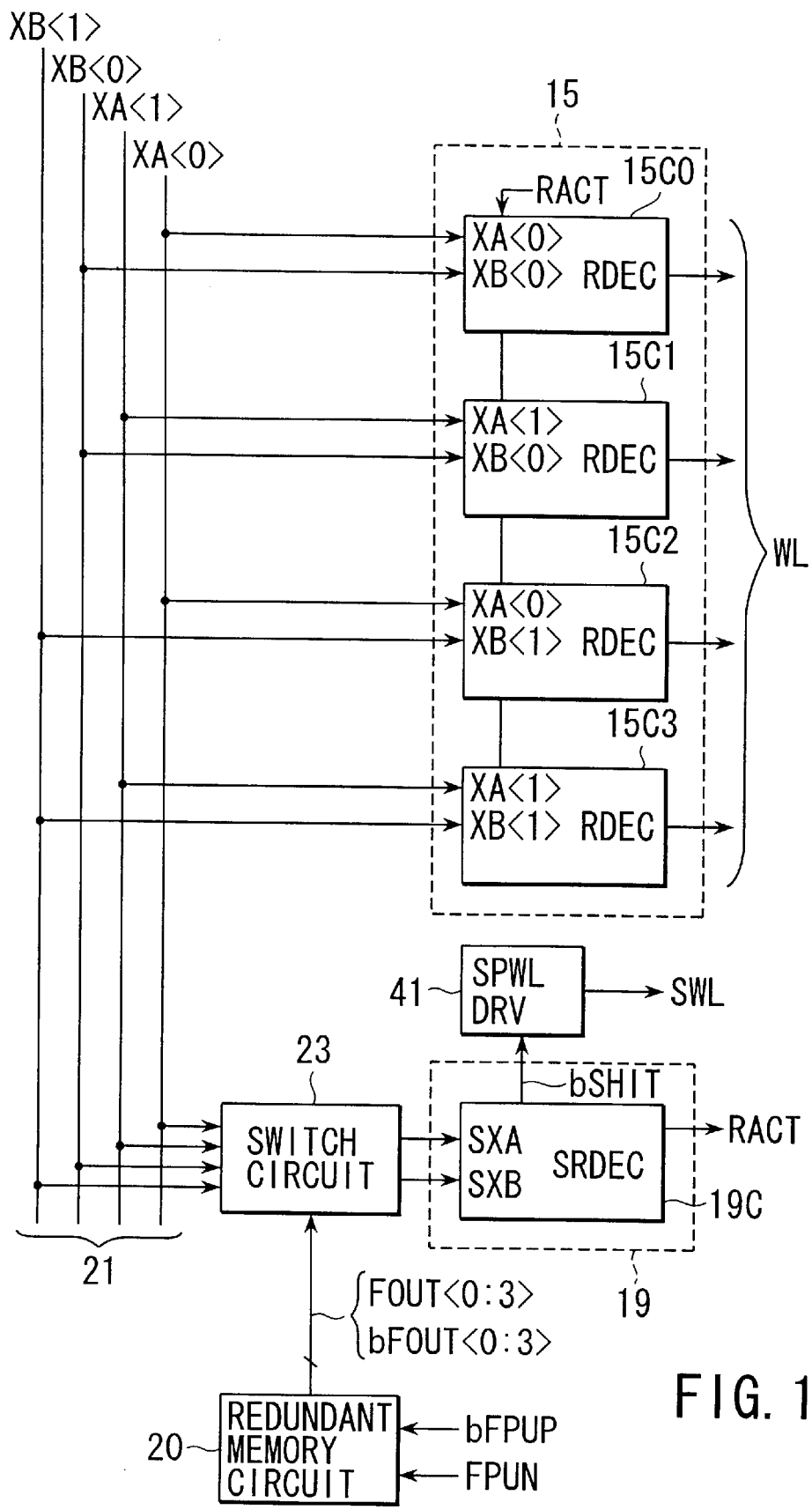
FIG. 18 is a block diagram of a row redundant circuit according to a sixth embodiment of the present invention.

FIG. 18 shows a sixth embodiment of the present invention.

The sixth embodiment is a modification of the fourth embodiment in FIG. 15. In FIG. 18, the same parts as those in FIG. 15 are indicated by the same reference numerals and only the parts different from FIG. 15 will be explained.

The sixth embodiment differs from the fourth embodiment in the configuration of the spare row decoder 19. Specifically, the spare row decoder circuit 19C has only a decode section for spare addresses and outputs a word line driver select signal bSHIT as a result of decoding. A spare word line driver (SPWLDRV) 41 drives the spare word line SWL according to the word line driver select signal bSHIT.

Figure 19:
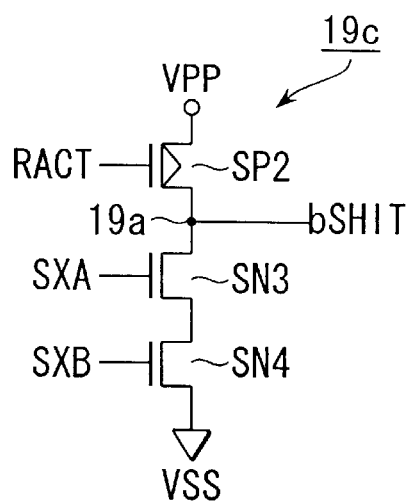
FIG. 19 is a circuit diagram of an example of the spare row decoder circuit in FIG. 18.

FIG. 19 shows an example of the spare row decoder circuit 19C. In this example, to simplify the explanation below, only the part corresponding to a single spare word line is shown.

The high power-supply potential VPP is supplied to the source of a p-channel MOS transistor SP2, whose drain is connected to a node 19a. The row activating signal RACT is supplied to its gate. Between the node 19a and the ground, n-channel MOS transistors SN3, SN4 are connected in series. The spare row address signals SXA, SXB are supplied to the gates of the MOS transistors SN3, SN4, respectively.

In the spare row decoder circuit 19C with the above configuration, when both of the spare row address signals SXA, SXB are at the high level, both of the MOS transistors SN3, SN4 turn on, placing the node 19a at the low level. As a result, a low word line driver select signal bSHIT is outputted at the node 19a. Moreover, when the row decoder circuit is activated, the row activating signal RACT is at the high level. This causes a MOS transistor SP2 to turn on, placing the word line driver select signal bSHIT at the high level.

Figure 20:
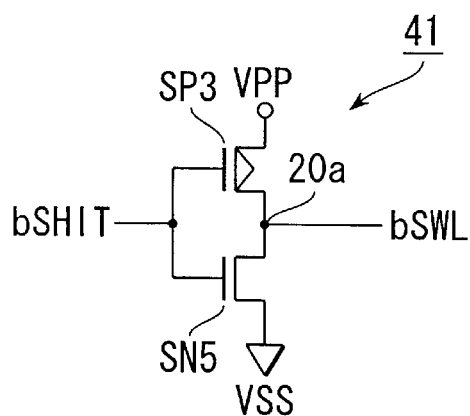
FIG. 20 is a circuit diagram of an example of the spare word line driver in FIG. 18.

FIG. 20 shows an example of the spare word line driver 41. In this example, to simplify the explanation below, only the part corresponding to a single spare word line is shown. The word line driver select signal bSHIT outputted from the spare row decoder circuit 19A is supplied to the gate of a p-channel MOS transistor SP3 and that of an n-channel MOS transistor SN5. The high power-supply potential VPP is supplied to the source of the p-channel MOS transistor SP3, whose drain is connected to the drain of the MOS transistor SN5. The source of the MOS transistor SN5 is grounded. The node 20a to which the drains of the MOS transistors SN5, SP3 are connected is connected to a specific single spare word line SWL.

The operation of the semiconductor memory device according to the sixth embodiment is almost the same as that of the semiconductor memory device according to the fourth embodiment except for the operation of the spare row decoder circuit 19C. When both of the spare row address signals SXA, SXB are at the high level, the spare row decoder circuit 19C outputs the word line driver select signal bSHIT. The word line driver select signal bSHIT is supplied to the spare word line driver 41, which drives a spare word line SWL.

With the sixth embodiment, the spare row decoder circuit 19C has only the decode section and separates the spare word line driver 41 for driving the spare word line SWL from the spare row decoder circuit 19C. As a result, the spare row decoder circuit 19C, redundant memory circuit 20, and switch circuit 23 can be arranged in the peripheral circuit area with a relatively low integration instead of being provided in the vicinity of the memory core where high integration is required. Therefore, it is possible to suppress an increase in the chip area and further shorten the access time.

<Seventh Embodiment>

Figure 21:
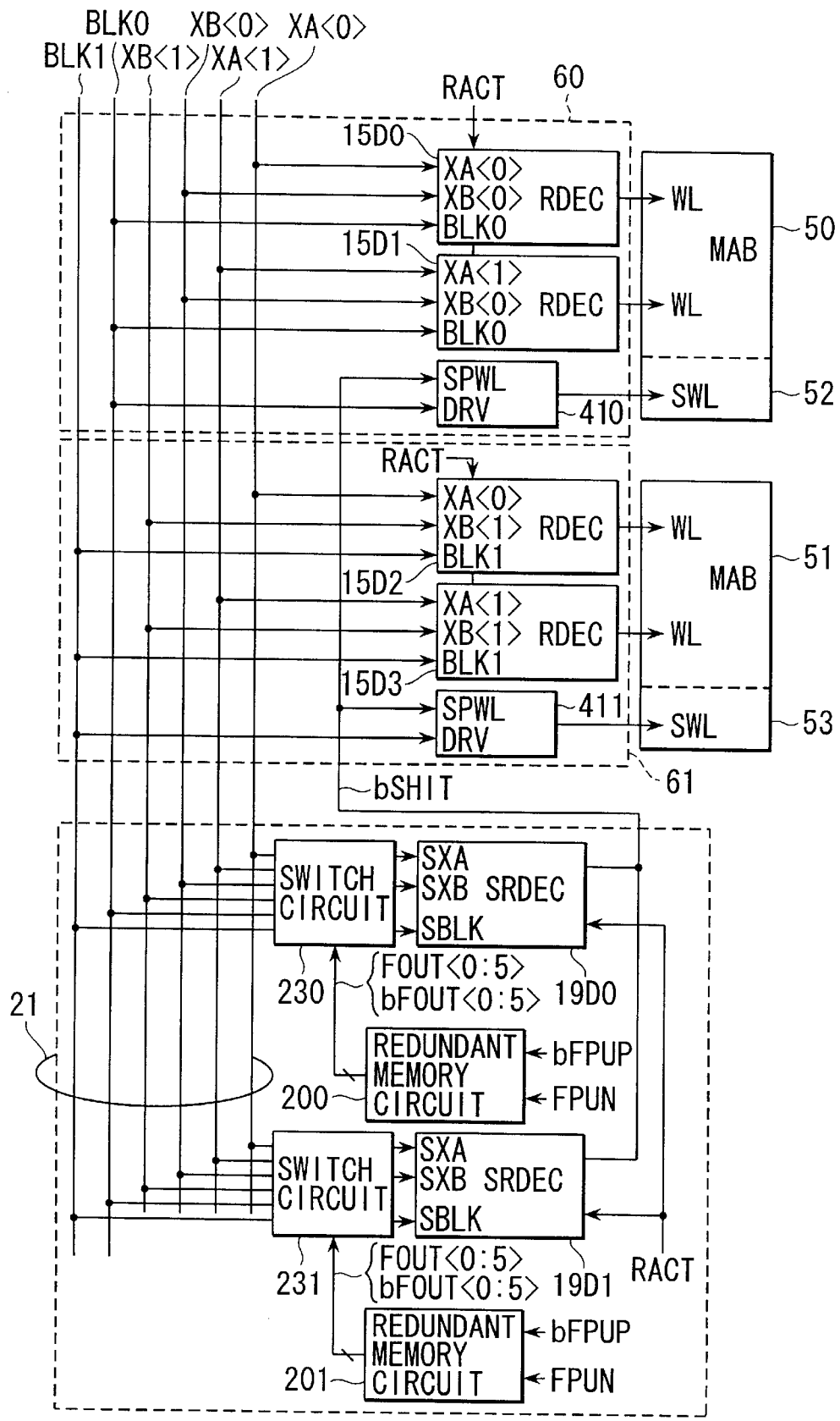
FIG. 21 is a block diagram of a row redundant circuit according to a seventh embodiment of the present invention.

FIG. 21 shows a seventh embodiment of the present invention. The seventh embodiment is basically the same as the sixth embodiment. A plurality of units of the circuit shown in FIG. 18 are provided in such a manner that they correspond to a plurality of memory array blocks. This arrangement enables defective word lines in each memory array block to be relieved by spare word lines in a spare memory array block arranged adjacent to each memory array block.

In FIG. 21, spare memory array blocks 52, 53 are arranged next to memory array blocks (MAB) 50, 51, respectively. A decoder block 60 is provided in such a manner that it corresponds to the memory array block (MAB) 50 and spare memory array block 52. A decoder block 61 is provided in such a manner that it corresponds to the memory array block (MAB) 51 and spare memory array block 53.

The decoder block 60 includes row decoder circuits 15D0, 15D1 and a spare word line driver 410. The decoder block 61 includes row decoder circuits 15D2, 15D3 and a spare word line driver 411. The row decoder circuits 15D0 to 15D3 have almost the same configuration as that of the block decoder circuits 15C0 to 15C3 of FIG. 8 except that they further include a decode section for block select signals BLK<0:1>.

The spare word line drivers 410, 411 have almost the same configuration as that of the spare word line driver 41 shown in FIG. 18. They are selected by the word line driver select signal bSHIT and the block select signal BLK<0:1>.

Redundant memory circuits 200, 201 have almost the same configuration as that of the redundant memory circuit 20 except that they further include circuits for storing defective block addresses. Spare row decoder circuits 19D0, 19D1 have almost the same configuration as that of the spare row decoder circuit 19C except that they further include a decode section for block select signals BLK<0:1>. Switch circuits 230, 231 have almost the same configuration as that of the switch circuit 23. The switch circuits 230, 231 further include circuits for connecting signal lines for transmitting the block select signal BLK<0:1> with the spare row decoder circuits 19D0, 19D1 according to the defective block address signals supplied from the redundant memory circuits 200, 201, respectively.

Figure 22:
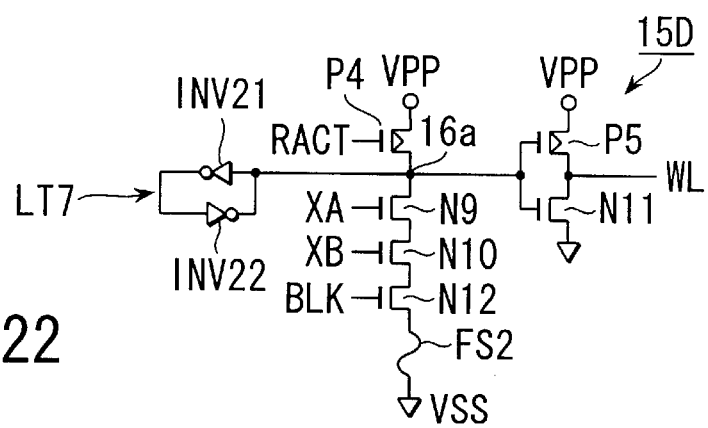
FIG. 22 is a circuit diagram of an example of the row decoder circuit in FIG. 21.

FIG. 22 shows an example of the row decoder circuit 15D0. In FIG. 22, the same parts as those in FIG. 16 are indicated by the same reference numerals and only the parts different from FIG. 16 will be explained. In the row decoder circuit 15D, an n-channel MOS transistor N12 is connected between a MOS transistor N10 and a fuse FS2. The block select signal BLK is supplied to the gate of the MOS transistor N12.

In the row decoder circuit 15D with the above configuration, in a case where the fuse FS2 has not been blown, when the row address signals XA, XB and block select signal BLK go high, turning on the MOS transistors N9, N10, and N12, the MOS transistor P5 turns on, thereby supplying the high potential VPP to a word line WL. Moreover, when at least one of the MOS transistors N9, N10, and N12 is in the off state, or when the row activating signal RACT goes low, the MOS transistor P5 turns off and the MOS transistor N11 turns on. As a result, the ground potential is supplied to the word line WL.

On the other hand, in a case where the fuse FS2 has been blown, even when the row address signals XA, XB and block select signal BLK go high, turning on the MOS transistors N9, N10, and N12, the potential at the node 16a remains at the power supply potential VPP. As a result, the MOS transistor N11 turns on, supplying the ground potential VSS to the word line WL.

Figure 23:
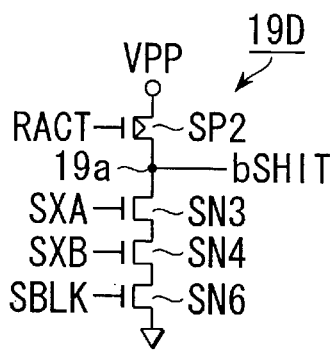
FIG. 23 is a circuit diagram of an example of the spare row decoder circuit in FIG. 21.

FIG. 23 shows an example of the spare row decoder circuit 19D. In FIG. 23, the same parts as those in FIG. 19 are indicated by the same reference numerals and only the parts different from FIG. 19 will be explained.

Between the MOS transistor SN4 and the ground, an n-channel MOS transistor SN6 is connected. The spare block select signal SBLK is supplied to the gate of the MOS transistor SN6.

In the spare row decoder circuit 19D with the above configuration, when the spare row address signals SXA, SXB and spare block select signal SBLK are all at the high level, the MOS transistors SN3, SN4, and SN6 all turn on, placing the node 19a at the low level. As a result, the low word line driver select signal bSHIT is outputted at the node 19a. In addition, when the row decoder circuit is activated, the row activating signal RACT is at the high level. This causes the MOS transistor SP2 to turn on, bringing the word line driver select signal bSHIT to the high level.

Figure 24:
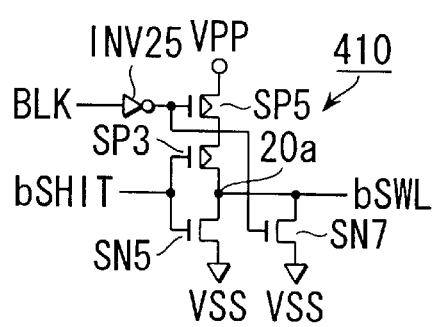
FIG. 24 is a circuit diagram of an example of the spare word line driver in FIG. 21.

FIG. 24 shows an example of the spare word line driver 410. In FIG. 24, the same parts as those in FIG. 20 are indicated by the same reference numerals and the parts different from FIG. 20 will be explained.

The drain of a p-channel MOS transistor SP5 is connected to the source of the p-channel MOS transistor SP3. The high power-supply potential VPP is supplied to the source of the MOS transistor SP5. The block select signal BLK is supplied via an inverter circuit INV25 to the gate of the MOS transistor SP5. Moreover, between the node 20a and the ground, an n-channel MOS transistor SN7 is connected. The gate of the MOS transistor SN7 is connected to the output terminal of the inverter circuit INV25.

With the above configuration, when the spare row decoder circuit is selected, the word line driver select signal bSHIT goes low, and the block select signal BLK goes high, the MOS transistors SP3, SP5 turn on and the high power-supply voltage VPP is supplied to the spare word line SWL. Furthermore, when the word line driver select signal bSHIT goes high or the block select signal BLK goes low, at least one of the MOS transistors SP3, SP5 turns off and at least one of the MOS transistors SN5, SN7 turns on. As a result, the node 20a goes to the ground potential VSS. The ground potential VSS is supplied to the spare word line SWL.

With the above configuration, the operation of the seventh embodiment will be explained.

First, when the result of the initial test (for example, die sort test) has shown that there is a defective memory cell in at least one of the memory array blocks 50, 51, specific fuses in the redundant memory circuits 200, 201 are blown by, for example, a laser, and the defective row address and defective block for selecting the defective memory cell are stored. Then, the fuse FS2 in the row decoder circuits 15D0 to 15D3 to select the defective memory cell is blown, preventing the row decoder circuit from being activated.

When the signals bFPUP, FPUN are supplied to the redundant memory circuits 200, 201 at the time of turning on the power supply as described above, the redundant memory circuits 200, 201 output the defective row address signals FOUT<0:5>, bFOUT<0:5>. The defective row address signals FOUT<0:5>, bFOUT<0:5> are supplied to the switch circuits 230, 231. According to the defective row address signals FOUT<0:5>, bFOUT<0:5> supplied, the switch circuits 230, 231 select either of the wires for transmitting the row address signals XA<0:1>, either of the wires for transmitting the row address signals XB<0:1>, and either of the wires for transmitting the block select signals BLK<0:1> and connects the selected wire to the wire for transmitting the spare row address signals SXA, SXB, and spare block select signal SBLK for the spare row decoder circuits 19D0, 19D1.

Therefore, in an actual operation, when the row address buffer 13 generates the row address signals XA<0:1>, XB<0:1> and block select signals BLK<0:1>, these row address signals and block select signals are supplied via the transfer gates of the switch circuits 230, 231 directly to the spare row decoder circuits 19D0, 19D1. When the row address signals and block select signals correspond to the defective row address, the spare word line drivers 410, 411 are driven and the spare word line SWL is activated. The row decoder circuits replaced with the spare row decoder circuits 19D0, 19D1 will never be selected even when the defective row address signals and block select signals are supplied.

In the seventh embodiment, the spare word line drivers 410, 411 are separated from the spare row decoder circuits 19D0, 19D1 and only the spare word line drives 410, 411 are arranged in the vicinity of the spare array blocks 52, 53 adjacent to the respective memory blocks 50, 51. As a result, the spare row decoder circuits 19D0, 19D1, redundant memory circuits 200, 201, and switch circuits 230, 231 can be arranged in the peripheral circuit area with a relatively low integration instead of being provided in the vicinity of the memory core where high integration is required. Therefore, it is possible to suppress an increase in the chip area and further shorten the access time.

In the seventh embodiment, the number of spare row decoder circuits is not necessarily one for a single spare word line driver. For example, such a flexible configuration as has five spare row decoder circuits provided for 10 spare word line drivers 10 is possible. With this configuration, an increase in the chip area can be suppressed more.

<Eighth Embodiment>

Figure 25:
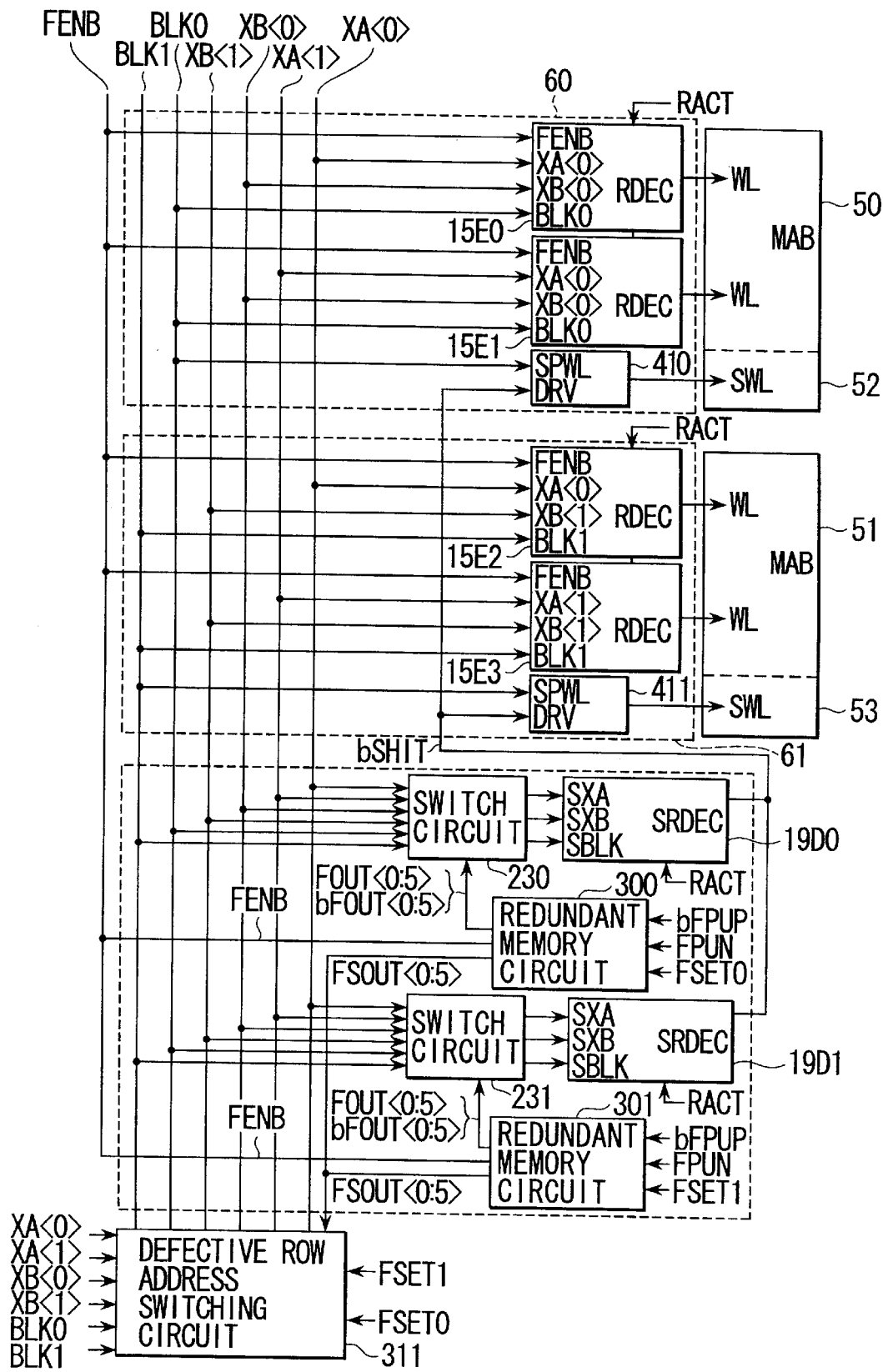
FIG. 25 is a block diagram of a row redundant circuit according to an eighth embodiment of the present invention.

FIG. 25 shows an eighth embodiment of the present invention. The eighth embodiment is basically the same as the third embodiment shown in FIG. 11. As shown in the seventh embodiment of FIG. 21, a plurality of units of the circuit shown in FIG. 11 are provided in such a manner that they correspond to a plurality of memory array blocks. This arrangement enables defective word lines in each memory array block to be relieved by spare word lines in a spare memory array block arranged adjacent to each memory array block. In FIG. 25, the same parts as those in FIG. 21 are indicated by the same reference numerals and explanation of them will be omitted.

In FIG. 25, spare memory array blocks 52, 53 are arranged next to memory array blocks (MAB) 50, 51, respectively. A decoder block 60 is provided in such a manner that it corresponds to the memory array block (MAB) 50 and spare memory array block 52. A decoder block 61 is provided in such a manner that it corresponds to the memory array block (MAB) 51 and spare memory array block 53.

The decoder block 60 includes row decoder circuits 15E0, 15E1 and a spare word line driver 410. The decoder block 61 includes row decoder circuits 15E2, 15E3 and a spare word line driver 411. The row decoder circuits 15E0 to 15E3 have almost the same configuration as that of the block decoder circuits 15B0 to 15B3 except that they further include a decode section for block select signals BLK<0:1>.

The spare word line drivers 410, 411 are selected by the word line driver select signal bSHIT and the block select signals BLK<0:1>.

Redundant memory circuits 300, 301 have almost the same configuration as that of the redundant memory circuit 30 except that they further include circuits for storing defective block addresses. Spare row decoder circuits 19D0, 19D1 further include a decode section for block select signals BLK<0:1>.

Switch circuits 230, 231 have almost the same configuration as that of the switch circuit 23 of FIG. 4. The switch circuits 230, 231 further include circuits for connecting signal lines for transmitting the block select signals BLK<0:1> with the spare row decoder circuits 19D0, 19D1 according to the defective block address signals supplied from the redundant memory circuits 300, 301, respectively.

According to the redundancy set signals FSET0, FSET1 supplied at the time of turning on the power supply, the defective row address switching circuit 311 switches from the row address buffer 13 to the redundant memory circuits 300, 301, thereby supplying the defective row address signals FSOUT<0:5> (including the block address signal) supplied from the redundant memory circuits 300, 301. The defective row address signals FSOUT<0:5> are supplied to the circuits 230, 231, row decoder circuits 15E0 to 15E3, and spare word line drivers 410, 411.

Furthermore, when the power supply is turned on, the redundant memory circuits 300, 301 output the fuse enable signal FENB according to the redundancy set signals FSET0, FSET1. The fuse enable signal FENB is supplied to the row decoder circuits 15E0 to 15E3.

Figure 26:
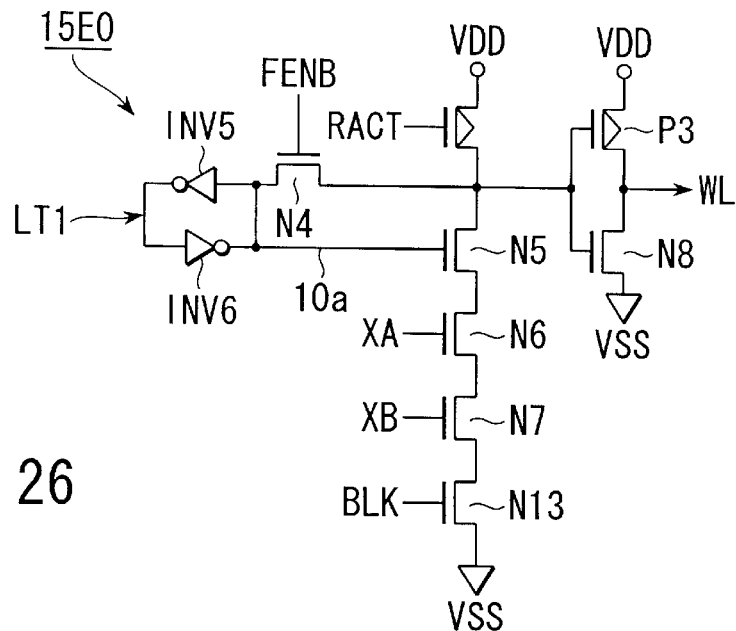
FIG. 26 is a circuit diagram of an example of the row decoder circuit in FIG. 25.

FIG. 26 shows an example of the row decoder circuit 15E0. Since the row decoder circuit 15E0 is almost the same as the circuit of FIG. 10, the same parts as those in FIG. 10 are indicated by the same reference numerals and only the parts different from FIG. 10 will be explained.

In FIG. 26, between the MOS transistor N7 and the ground, an n-channel transistor N13 is connected. The block select signal BLK is supplied to the gate of the MOS transistor N13.

The operation of this circuit is almost the same as that of FIG. 10. Specifically, when the row address signals XA, XB and block select signal BLK are at the high level, all of the MOS transistors N5, N6, N7, and N13 go high. In this state, when the transistor N4 is turned on according to the fuse enable signal FENB, the stored data in the latch circuit LT1 is inverted, thereby turning off the MOS transistor N5. As a result, even when the row address signals XA, XB and block select signal BLK go high in a normal operation, the row decoder circuit will not be activated.

Figure 27:
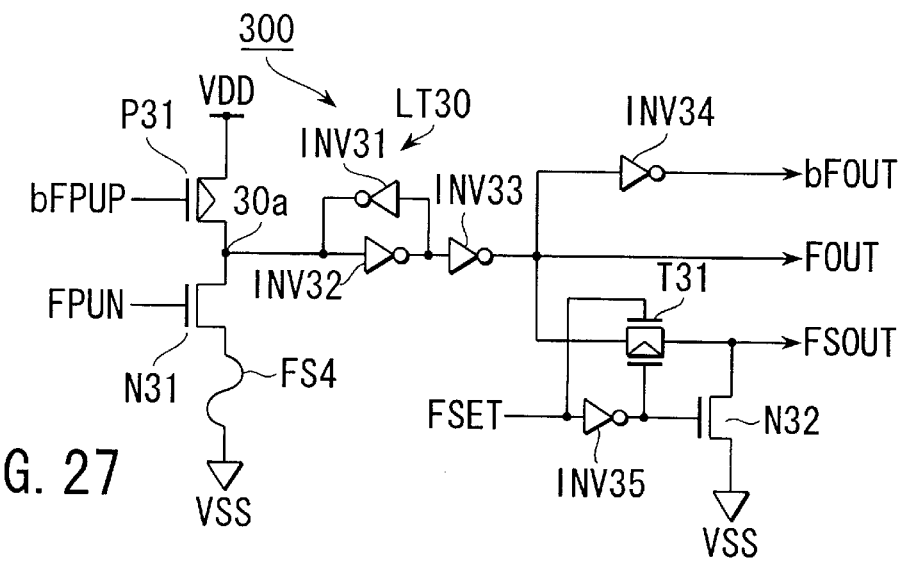
FIG. 27 is a circuit diagram of an example of the redundant memory circuit in FIG. 25.

FIG. 27 is a circuit diagram of an example of the redundant memory circuit 300 (301), showing a memory circuit for a defective row address.

In FIG. 27, the high power-supply potential VDD is supplied to the source of a p-channel MOS transistor P31, whose drain is connected to a node 30a. The signal bFPUP is supplied to its gate. Between the node 30a and the ground, an n-channel MOS transistor N31 and a memory element fuse FS4 are connected in series. The signal FPUN is supplied to the gate of the MOS transistor N31. One end of a latch circuit LT30 composed of two inverter circuits INV31 and INV32 is connected to the node 30a. The other end of the latch circuit LT30 is connected to the input terminal of an inverter circuit INV33. The inverter circuit INV33 outputs a defective row address signal FOUT at its output terminal. The input terminal of an inverter circuit INV34 is connected to the output terminal of the inverter circuit INV33. The inverter circuit INV 34 outputs a defective row address signal bFOUT at its output terminal.

One end of a transfer gate T31 is connected to the output terminal of the inverter circuit INV33. The transfer gate T31 outputs the defective row address signal FSOUT at its other terminal. The redundancy set signal FSET is supplied to the gate of an n-channel MOS transistor constituting the transfer gate T31. To the gate of a p-channel MOS transistor, the redundancy set signal FSET is supplied via an inverter circuit INV35. In addition, between the output terminal of the transfer gate T31 and the ground, an n-channel MOS transistor 32 is connected. The redundancy set signal FSET is supplied via the inverter circuit INV35 to the gate of the MOS transistor 32.

The operation of the redundant memory circuit 300 in FIG. 27 is almost the same as that of the circuit in FIG. 12A. Specifically, when the power supply is turned on, information on the fuse FS4 is read according to the signals bFPUP, FPUN supplied to the respective gates of the MOS transistors P31 and MOS transistor N31. When the fuse FS4 has been blown, the inverter circuit INV33 outputs a high defective row address signal FOUT and the inverter circuit INV34 outputs a low defective row address signal bFOUT.

Furthermore, in the redundancy set operation mode performed after the turning on of the power supply, when the redundancy set signal FSET is made high, the transfer gate T31 outputs a defective row address signal FSOUT. When the redundancy set signal FSET is made low, this turns on the MOS transistor N32, causing the defective row address signal FSOUT to go to the low level.

Figure 28:
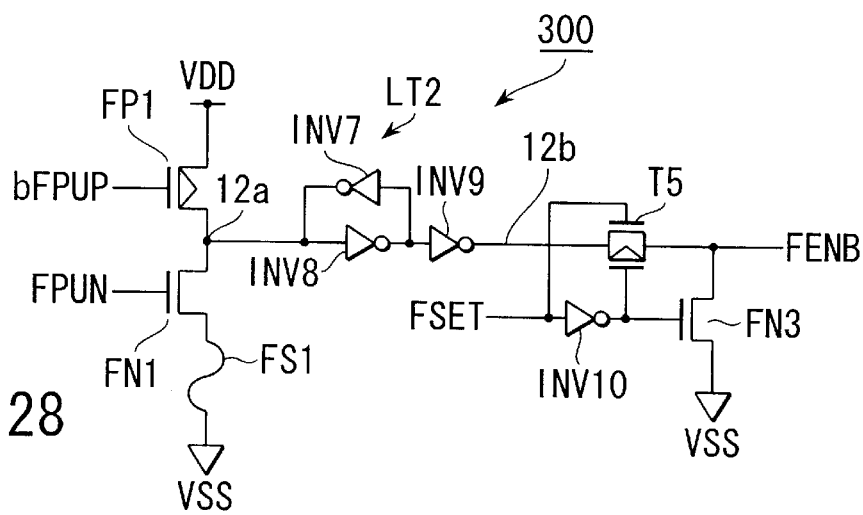
FIG. 28 is a circuit diagram of another example of the redundant memory circuit in FIG. 25.

FIG. 28 shows a memory circuit for storing information as to whether the fuse in the redundant memory circuit 300 is in use. The circuit is the same as that of FIG. 12C and the same parts as those of FIG. 12C are indicated by the same reference numerals and explanation of them will be omitted.

Figure 29:
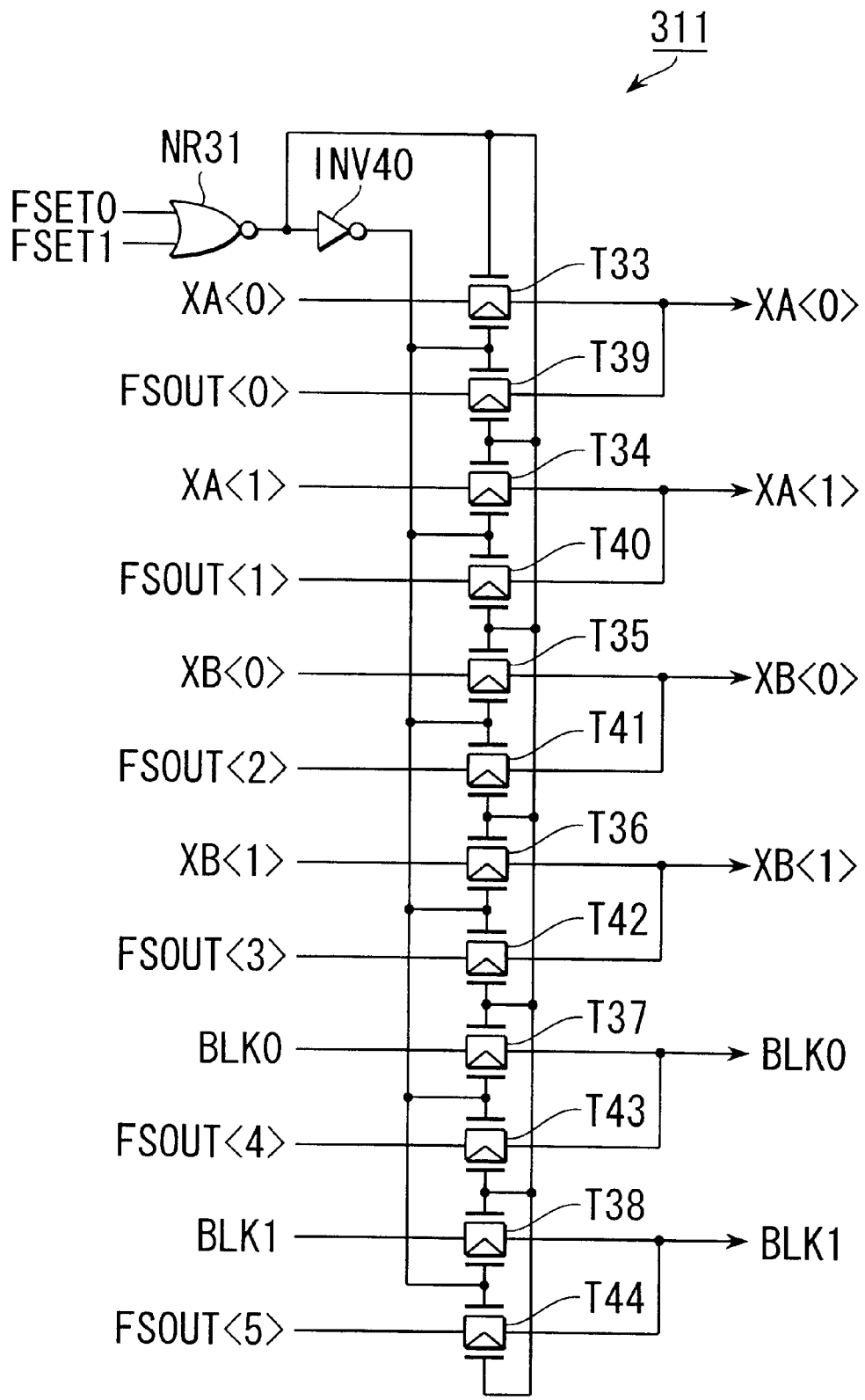
FIG. 29 is a circuit diagram of an example of the defective row address switching circuit in FIG. 25.

FIG. 29 shows an example of the defective row address switching circuit 311. The row address signals XA<0:1>, XB<0:1> and block select signals BLK<0:1> outputted from the low address buffer 13 are supplied to one end sides of transfer gates T33 to T38, respectively. In addition, the defective address signals FSOUT<0:5> supplied from the redundant memory circuits 300 and 301 are supplied to one end sides of transfer gates T39 to T44, respectively. The other ends of the transfer gates T33 to T38 are connected to the other ends of the transfer gates T39 to T44. The row address signals XA<0:1>, XB<0:1> and block select signals BLK<0:1> are outputted at the other ends of the transfer gates T33 to T38.

In the redundancy operation mode, externally supplied redundancy set signals FSET0, FSET1 are supplied to the input terminal of a NOR circuit NR31. The output signal of the NOR circuit NR31 is supplied to the gates of n-channel MOS transistors constituting the transfer gates T33 to T38 and the gates of p-channel MOS transistors constituting the transfer gates T39 to T44. Moreover, the output signal of the NOR circuit NR31 is supplied via an inverter circuit INV40 to the gates of p-channel MOS transistors constituting the transfer gates T33 to T38 and the gates of n-channel MOS transistors each constituting the transfer gates T39 to T44.

The redundancy set signals FSET0, FSET1 are used to latch redundancy information in the switch circuits 230, 231 and row decoder circuits 15E0 to 15E3 only when the power supply is turned on. As for these redundancy set signals FSET0, FSET1, for example, the redundancy set signals FSET0 is first outputted and the defective row address signals FSOUT<0:5> are outputted according to the redundancy set signal FSET0. As a result, the defective row address signals outputted from the redundant memory circuit 300 are supplied to the defective row address switching circuit 311. In the defective row address switching circuit 311, the transfer gates T39 to T44 are made conducting according to the redundancy set signal FSET0. This causes the defective row address signals FSOUT<0:5> to be outputted via the transfer gates T39 to T44. The defective row address signals FSOUT<0:5> are supplied to the row decoder circuits 15E0 to 15E3, thereby deactivating the row decoder circuit corresponding to the defective row address signals.

Then, the redundancy set signal FSET1 is outputted and the defective row address signals FSOUT<0:5> are outputted from the redundant memory circuit 301 according to the redundancy set signal FSET1. As a result, the defective row address signals outputted from the redundant memory circuit 301 are supplied to the defective row address switching circuit 311. In the defective row address switching circuit 311, the transfer gates T39 to T44 are made conducting according to the redundancy set signal FSET1. This causes the defective row address signals FSOUT<0:5> to be outputted via the transfer gates T39 to T44. The defective row address signals FSOUT<0:5> are supplied to the row decoder circuit 15E0 to 15E3, thereby deactivating the row decoder circuit corresponding to the defective row address signals.

When the redundancy set operation mode has ended and the normal operation mode starts, the redundancy set signals FSET0, FSET1 both go low. As a result, in the defective row address switching circuit 311, the transfer gates T39 to T44 are made nonconducting and the transfer gates T33 to T38 are made conducting. Thus, when the row address buffer 13 outputs a row address signal and block select signal, these signals are supplied via the transfer gates T33 to T38 to the row decoder circuits 15E0 to 15E3, switch circuits 230, 231, and spare word line drivers 410, 411. At this time, the row decoder circuits replaced with the spare row decoder circuits 19D0, 19D1 are not selected.

In the eighth embodiment, the spare word line drivers 410, 411 are separated from the spare row decoder circuits 19D0, 19D1 and only the spare word line drives 410, 411 are arranged in the vicinity of the spare array blocks 52, 53 adjacent to the respective memory blocks 50, 51. As a result, the spare row decoder circuits 19D0, 19D1, redundant memory circuits 300, 301, and switch circuits 230, 231 can be arranged in the peripheral circuit area with a relatively low integration instead of being provided in the vicinity of the memory core where high integration is required. Therefore, it is possible to suppress an increase in the chip area and further shorten the access time.

While in each of the above embodiments, the defective word lines have been relieved according to the defective row addresses, the present invention is not limited to this. Use of the invention enables defective bit lines to be relieved according to defective column addresses.

In addition, although a fuse has been used as a memory element in the redundant memory circuit, a fuse is not necessarily used as the memory element and any memory element, such as a nonvolatile memory, may be used as long as it is capable of storing data.

Furthermore, in each of the above embodiments, although the switch circuits have been composed of MOS transistors, they are not necessarily composed of MOS transistors and may be made up of elements capable of switching.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array including a plurality of memory cells arranged in rows and columns;

a spare cell array including spare cells, said spare cells being to be replaced with defective memory cells in said memory cell array;

a memory circuit for storing the addresses of said defective memory cells;

an address buffer for outputting addresses for selecting said memory cells;

a decoder for selecting a memory cell in said memory cell array according to the address signal outputted from said address buffer and which includes a select circuit for said memory cells and a control circuit for deactivating said select circuit according to the address signal for said defective memory cell;

a spare decoder for selecting a spare cell in said spare array; and a switch circuit which is connected between said spare decoder and said address buffer and which enables only the defective address supplied from said address buffer to pass through according to the address of the defective memory cell outputted from said memory circuit when a power supply is turned on.

2. The semiconductor memory device according to claim 1, wherein said decoder includes a first transistor of first conductivity type to whose source a word line driving potential is applied; and second and third transistors of second conductivity type being connected in series between the drain of said first transistor and a specific potential, said address signal being supplied to the gate of said second transistor and the decode output signal supplied from said deactivating circuit being supplied to the gate of said third transistor.

3. The semiconductor memory device according to claim 1, wherein said spare decoder includes a decode circuit for decoding the address signal provided apart from said spare cell array, and a driving circuit for driving the memory cell selected according to the output signal of said decode circuit.

4. The semiconductor memory device according to claim 1, said control circuit includes a decode circuit for decoding the address signal, and a fuse connected to said decode circuit, the fuse being set in accordance with the defective address so that said memory cell may be selected or not selected.

5. The semiconductor memory device according to claim 1, wherein said switch circuit includes
   a plurality of switch elements, and
   a latch circuit for holding the switching state of each of said switch elements.

6. The semiconductor memory device according to claim 1, further comprising:
   a deactivating circuit which is connected to said memory circuit and decodes the address of the defective memory cell outputted from said memory circuit and supplies the resulting decode output signal to said control circuit of said decoder.

7. The semiconductor memory device according to claim 6, wherein said decoder includes
   a decode circuit for decoding said address signal; and
   a switch element which is connected to said decode circuit and is controlled by the decode output signal supplied from said deactivating circuit.

8. The semiconductor memory device according to claim 1, wherein said decoder includes
   a latch circuit,
   a first switch element which is connected to the output terminal of said latch circuit and is made conducting or nonconducting, depending on the information latched in said latch circuit, and
   a second switch element which is connected to said first switch element and decodes said address signal.

9. The semiconductor memory device according to claim 8, further comprising a third switch element which is connected to the input terminal of said latch circuit and is made conducting when said spare decoder is selected, wherein
   said latch circuit latches information for selecting or not selecting said memory cell according said address signal supplied to said second switch element, with said third switch element being conducting at the time of turning on the power supply.

10. The semiconductor memory device according to claim 8, further comprising an address generating circuit for generating an address signal for said memory cell array sequentially at the time of turning on the power supply and supplying the generated address signal to said decode circuit and spare decoder.

11. The semiconductor memory device according to claim 1, wherein said decoder includes
   a latch circuit for latching information for selecting or not selecting said memory cell,
   a first transistor of first conductivity type to whose source a word line driving potential is applied;
   second and third transistors of second conductivity type being connected in series between the drain of said first transistor and a specific potential, the information latched in said latch circuit being supplied to the gate of said second transistor and said address signal being supplied to the gate of said third transistor.

12. The semiconductor memory device according to claim 11, wherein said latch circuit latches information for selecting or not selecting said memory cell at the time of turning on the power supply.

13. A semiconductor memory device comprising:
   a memory cell array including a plurality of memory cells arranged in rows and columns;
   a spare cell array which is arranged adjacent to said memory cell array and includes spare cells;
   an address buffer for outputting addresses for selecting said memory cells;
   a memory circuit for storing the address of a defective memory cell in said memory cell array;
   a switching circuit which is connected between said memory circuit and address buffer and which outputs the defective address outputted from said memory circuit at the time of turning on a power supply and, in a normal operation, outputs the address from said address buffer;
   a decoder for selecting a memory cell in said memory cell array according to the address signal outputted from said switching circuit;
   a spare decoder for selecting a spare cell in said spare cell array; and
   a switch circuit which is connected between the output terminal of said switching circuit and spare decoder and which does switching in such a manner that it enables only the address of the defective memory cell supplied from said address buffer to pass through according to the address of the defective memory cell outputted from said switching circuit at the time of turning on the power supply, wherein
   said decoder includes a select circuit for selecting the memory cell corresponding to said defective address according to the defective address supplied from said switching circuit and a control circuit for deactivating the select circuit.

14. The semiconductor memory device according to claim 13, wherein said spare decoder includes
   a decode circuit for addresses provided apart from said spare cell array, and
   a driving circuit for driving the memory cell selected according to the output signal of said decode circuit.

15. The semiconductor memory device according to claim 13, wherein said switch circuit includes
   a plurality of switch elements, and
   a latch circuit for holding the switching state of each of said switch elements.

16. A semiconductor memory device comprising:
   a memory cell array including a plurality of memory cell blocks, each of said memory cell blocks having a plurality of memory cells arranged in rows and columns;
   spare cell arrays arranged adjacent to said respective memory cell blocks, each of said spare cell arrays including a plurality of spare cells, said spare cell being to be replaced with defective memory cells in said memory cell array;
   an address buffer for outputting an address for selecting a memory cell in each of said memory cell blocks;
   a plurality of decoders for selecting a memory cell in each of said memory cell blocks according to the address outputted from said address buffer and which each includes a select circuit for said memory cell and a control circuit for deactivating said select circuit according to the address signal for said defective memory cell;
   a plurality of spare decoders for selecting spare cells in said respective spare cell arrays;
   a plurality of driving circuits for driving a spare cell according to the output signal of each of said spare decoders;
   a plurality of memory circuits for storing the address of a defective memory cell in each of said memory cell blocks; and a plurality of switch circuits which are connected between said address buffer and said respective spare decoders and which do switching in such a manner that they enable only the address of the defective memory cell supplied from said address buffer to pass through according to the address of the defective memory cell outputted from said memory circuit at the time of turning on a power supply.

17. The semiconductor memory device according to claim 16, wherein said memory circuits, spare decoders, and switch circuits are provided apart from said memory cell array.

18. The semiconductor memory device according to claim 16, wherein said control circuit includes a decode circuit for decoding an address signal, and a fuse connected to said decode circuit, the fuse being set in accordance with a defective address so that said memory cell may be selected or not selected.

19. The semiconductor memory device according to claim 16, wherein said switch circuit includes a plurality of switch elements and a latch circuit for holding the switching state of each of said switch elements.

20. The semiconductor memory device according to claim 16, further comprising a switching circuit which is connected between said memory circuit and address buffer and which outputs the defective address outputted from said memory circuit at the time of turning on the power supply and, in an normal operation, outputs the address from said address buffer.

* * * * *

UNITED STATES PATENT AND TRADEMARK OFFICE
CERTIFICATE OF CORRECTION

PATENT NO.    : 6,310,806 B1
DATED         : October 30, 2001
INVENTOR(S)   : Tomoki Higashi et al.

It is certified that error appears in the above-identified patent and that said Letters Patent is hereby corrected as shown below:

<u>Column 32,</u>
Line 3, delete "elements and" and insert -- elements, and --.

Signed and Sealed this

Thirtieth Day of July, 2002

Attest:

JAMES E. ROGAN
*Attesting Officer*          *Director of the United States Patent and Trademark Office*